(12) United States Patent
Chen et al.

(10) Patent No.: US 12,713,628 B2
(45) Date of Patent: Aug. 18, 2026

(54) STRUCTURE AND FORMATION METHOD OF INTEGRATED CHIPS PACKAGE WITH CAPACITOR

(71) Applicant: TAIWAN SEMICONDUCTOR MANUFACTURING COMPANY, LTD., Hsinchu (TW)

(72) Inventors: Wei-Ting Chen, Tainan City (TW); Chung-Hao Tsai, Changhua County (TW); Chen-Hua Yu, Hsinchu City (TW); Chuei-Tang Wang, Taichung City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 514 days.

(21) Appl. No.: 18/314,939

(22) Filed: May 10, 2023

(65) Prior Publication Data

US 2024/0379738 A1 Nov. 14, 2024

(51) Int. Cl.
*H10D 1/00* (2025.01)
*H10D 1/68* (2025.01)
(Continued)

(52) U.S. Cl.
CPC ............. *H10D 1/042* (2025.01); *H10D 1/716* (2025.01); *H10W 72/00* (2026.01); *H10W 90/00* (2026.01); *H10W 20/20* (2026.01); *H10W 72/921* (2026.01); *H10W 72/941* (2026.01); *H10W 72/9415* (2026.01); *H10W 72/944* (2026.01); *H10W 72/951* (2026.01); *H10W 72/952* (2026.01); *H10W 72/953* (2026.01); *H10W 80/312* (2026.01); *H10W 80/327* (2026.01); *H10W 90/297* (2026.01); *H10W 90/792* (2026.01)

(58) Field of Classification Search
CPC ......... H01L 24/05; H01L 24/08; H01L 24/80; H01L 25/0657; H01L 24/06; H01L 2224/80895; H01L 2224/80896; H01L 2225/06541; H01L 2924/059; H01L 23/481; H01L 2224/80357; H01L 25/50; H10D 1/716
See application file for complete search history.

(56) References Cited

U.S. PATENT DOCUMENTS 8,993,380 B2 3/2015 Hou et al.
9,281,254 B2 3/2016 Yu et al.
(Continued)

*Primary Examiner* — Mamadou L Diallo
(74) *Attorney, Agent, or Firm* — Birch, Stewart, Kolasch & Birch, LLP

(57) ABSTRACT

A package structure and a formation method are provided. The method includes forming a capacitor element over a first chip structure and forming a dielectric layer over the capacitor element. The method also includes forming a conductive bonding structure in the dielectric layer. A top surface of the conductive bonding structure is substantially coplanar with a top surface of the dielectric layer. The conductive bonding structure penetrates through the capacitor element and is electrically connected to the capacitor element. The method further includes bonding a second chip structure to the dielectric layer and the conductive bonding structure through dielectric-to-dielectric bonding and metal-to-metal bonding.

20 Claims, 32 Drawing Sheets

(51) Int. Cl.

| | |
|---|---|
| ***H10W 20/20*** | (2026.01) |
| ***H10W 72/00*** | (2026.01) |
| ***H10W 72/90*** | (2026.01) |
| ***H10W 80/00*** | (2026.01) |
| ***H10W 90/00*** | (2026.01) |
| ***H10W 90/20*** | (2026.01) |

(56) References Cited

U.S. PATENT DOCUMENTS

| | | | | |
|---|---|---|---|---|
| 9,299,649 | B2 | 3/2016 | Chiu et al. | |
| 9,372,206 | B2 | 6/2016 | Wu et al. | |
| 9,425,126 | B2 | 8/2016 | Kuo et al. | |
| 9,443,783 | B2 | 9/2016 | Lin et al. | |
| 9,461,018 | B1 | 10/2016 | Tsai et al. | |
| 9,496,189 | B2 | 11/2016 | Yu et al. | |
| 9,666,502 | B2 | 5/2017 | Chen et al. | |
| 9,735,131 | B2 | 8/2017 | Su et al. | |
| 11,257,750 | B2 * | 2/2022 | Li | H01L 23/5256 |
| 2018/0240860 | A1 * | 8/2018 | Yang | H01L 24/83 |
| 2021/0358846 | A1 * | 11/2021 | Wu | H01L 23/544 |
| 2022/0285434 | A1 * | 9/2022 | Shen | H10N 50/10 |
| 2022/0344301 | A1 * | 10/2022 | Yu | H01L 24/80 |
| 2023/0060324 | A1 * | 3/2023 | Liu | H10D 1/716 |
| 2023/0068578 | A1 * | 3/2023 | Yu | H01L 23/5223 |
| 2023/0369302 | A1 * | 11/2023 | Yu | H01L 24/80 |
| 2024/0030168 | A1 * | 1/2024 | Chen | H01L 23/585 |
| 2024/0266308 | A1 * | 8/2024 | Lee | H10B 12/50 |
| 2025/0087639 | A1 * | 3/2025 | Wen | H01L 23/481 |
| 2025/0098172 | A1 * | 3/2025 | Kim | H01L 24/08 |

* cited by examiner 504
302
502
114
116a 302
506C
506B
502
506A
114
116a 302
506C
506B
502
506A
114
508
116a 510
302
506C
506B
502
506A
114
508
116a

STRUCTURE AND FORMATION METHOD OF INTEGRATED CHIPS PACKAGE WITH CAPACITOR

BACKGROUND

The semiconductor integrated circuit (IC) industry has experienced rapid growth. Continuing advances in semiconductor manufacturing processes have resulted in semiconductor devices with finer features and/or higher degrees of integration. Functional density (i.e., the number of interconnected devices per chip area) has generally increased while feature sizes (i.e., the smallest component that can be created using a fabrication process) have decreased. This scaling-down process generally provides benefits by increasing production efficiency and lowering associated costs.

A chip package not only provides protection for semiconductor devices from environmental contaminants, but also provides a connection interface for the semiconductor devices packaged therein. Smaller package structures, which take up less space or are lower in height, have been developed to package the semiconductor devices.

New packaging technologies have been developed to further improve the density and functionality of semiconductor dies. These relatively new types of packaging technologies for semiconductor dies face manufacturing challenges.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
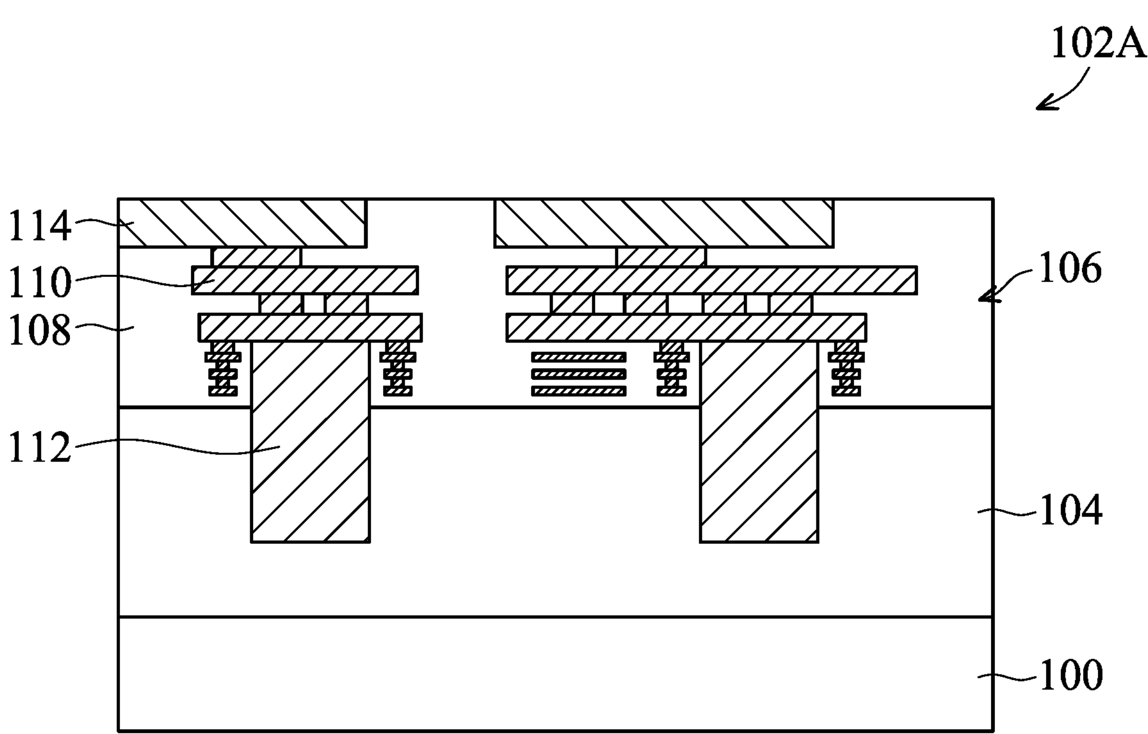
FIGS. 1A-1F are cross-sectional views of various stages of a process for forming a portion of a package structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Embodiments of the disclosure may relate to package structures such as three-dimensional (3D) packaging, 3D-IC devices, and 2.5D packaging. Embodiments of the disclosure form a package structure including a substrate that carries one or more dies or packages and a protective element (such as a protective lid) aside the dies or packages. The protective element may also function as a warpage-control element and/or heat dissipation element.

Other features and processes may also be included. For example, testing structures may be included to aid in the verification testing of the 3D packaging, 3DIC devices, and/or 2.5 D packaging. The testing structures may include, for example, test pads formed in a redistribution layer or on a substrate that allows testing to be conducted using probes or probe cards and the like. Verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1A-1F are cross-sectional views of various stages of a process for forming a package structure, in accordance with some embodiments. As shown in FIG. 1A, a chip structure (or a chip-containing structure) 102A is disposed over a carrier substrate 100, in accordance with some embodiments. The carrier substrate 100 may be a carrier wafer. The carrier wafer may include a semiconductor wafer (such as a silicon wafer), a dielectric wafer (such as a glass wafer), or the like.

In some embodiments, the chip structure 102A is a semiconductor wafer that includes multiple semiconductor chips. After a sawing process, multiple semiconductor chips that are separated from each other may be obtained. In some other embodiments, the chip structure 102A is a single semiconductor chip.

In some embodiments, the chip structure 102A includes a semiconductor substrate 104. In some embodiments, the semiconductor substrate 104 is a bulk semiconductor substrate, such as a semiconductor wafer. The semiconductor substrate 104 may include silicon or other elementary semiconductor materials such as germanium. The semiconductor substrate 104 may be un-doped or doped (e.g., p-type, n-type, or a combination thereof). In some embodiments, the semiconductor substrate 104 includes an epitaxially grown semiconductor layer on a dielectric layer. The epitaxially grown semiconductor layer may be made of silicon germanium, silicon, germanium, one or more other suitable materials, or a combination thereof.

In some other embodiments, the semiconductor substrate 104 includes a compound semiconductor. For example, the compound semiconductor includes one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions. Each of them is greater than or equal to zero, and added together they equal 1. The compound semiconductor may include silicon carbide, gallium arsenide, indium arsenide, indium phosphide, one or more other suitable compound semiconductors, or a combination thereof. Other suitable substrate including II-VI compound semiconductors may also be used.

In some embodiments, the semiconductor substrate 104 is an active layer of a semiconductor-on-insulator (SOI) substrate. The SOI substrate may be fabricated using a separation by implantation of oxygen (SIMOX) process, a wafer bonding process, another applicable method, or a combination thereof. In some other embodiments, the semiconductor substrate 104 includes a multi-layered structure. For example, the semiconductor substrate 104 includes a silicon-germanium layer formed on a bulk silicon layer.

Various device elements are formed in or over the semiconductor substrate 104. Examples of the various device elements include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), diodes, or other suitable elements. Various processes may be used to form the various device elements, including deposition, etching, implantation, photolithography, annealing, and/or other suitable processes.

The chip structure 102A includes a front-side interconnection portion 106, respectively. The front-side interconnection portion 106 includes multiple dielectric layers 108 and multiple conductive features 110 surrounded by the dielectric layers 108. The conductive features 110 may include conductive contacts, conductive lines, and conductive vias.

The dielectric layers 108 may be made of or include silicon oxide, silicon oxynitride, silicon nitride, carbon-containing silicon oxide, carbon-containing silicon nitride, carbon-containing silicon oxynitride, another suitable materials, or a combination thereof. The conductive features 110 may be made of or include copper, tungsten, cobalt, aluminum, another suitable material, or a combination thereof. The formation of the front-side interconnection portion 106 may involve multiple deposition processes, patterning processes, planarization processes, another applicable processes, or a combination thereof.

The device elements of the chip structure 102A are interconnected by the front-side interconnection portion 106 to form integrated circuit devices, such as a logic device, a memory device (e.g., static random access memory, SRAM), a radio frequency (RF) device, an input/output (I/O) device, a system-on-chip (SoC) device, one or more other types of devices, or a combination thereof.

In some embodiments, the chip structure 102A includes multiple through-chip vias 112 extending into the semiconductor substrate 104, as shown in FIG. 1A. Each of the through-chip vias 112 may be electrically connected to one or more of the conductive features 110 formed in the front-side interconnection portion 106. In some embodiments, a dielectric layer is formed between the semiconductor substrate 104 and the through-chip vias 112, so as to prevent short circuiting between the through-chip vias 112 and the semiconductor substrate 104.

In some embodiments, the front-side interconnection portion 106 further includes conductive features 114, as shown in FIG. 1A. The conductive features 114 may be made of or include copper, aluminum, another suitable material, or a combination thereof. In some embodiments, the conductive features 114 function as conductive pads or redistribution layers. Each of the conductive features 114 may be electrically connected to one or more of the conductive features 110 thereunder. In some embodiments, each of the conductive features 114 is thicker than each of the conductive features 110 thereunder. Each of the conductive features 114 may have a thickness that is within a range from about 2.5 μm to about 4.5 μm. Top metals of the conductive features 110 may have a thickness that is within a range from about 0.5 μm to about 1 μm.

Figure 1B:
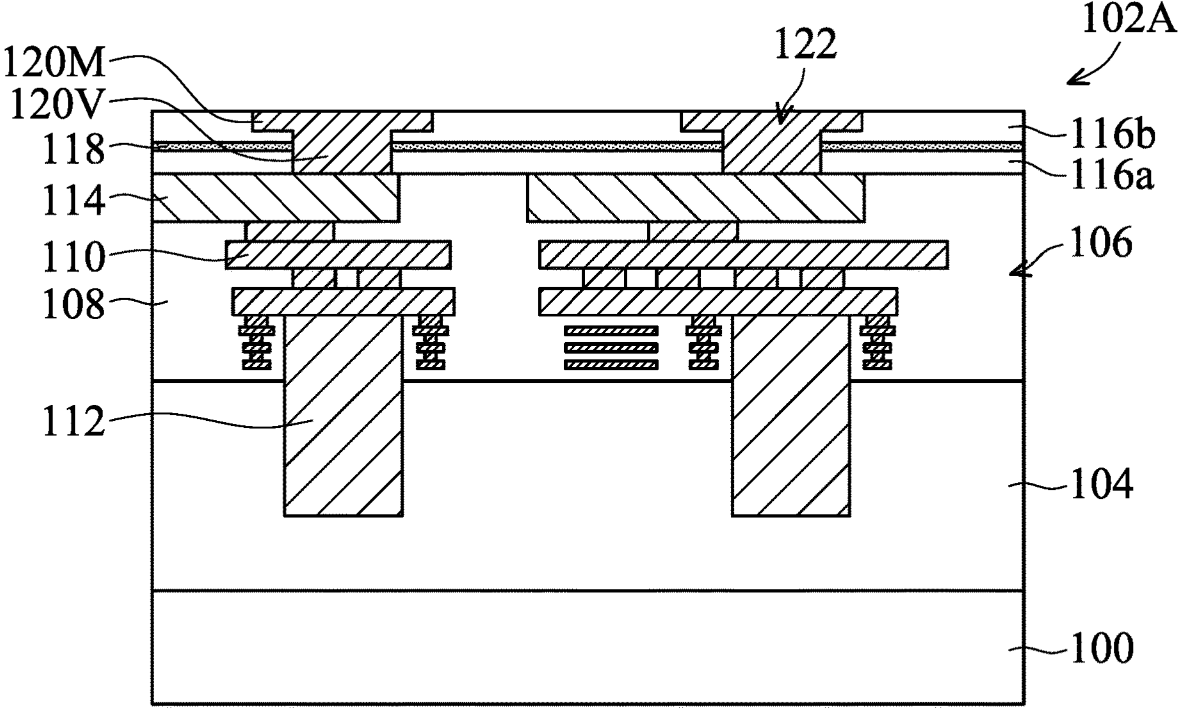

As shown in FIG. 1B, a dielectric layer 116*a* is deposited over the front-side interconnection portion 106, in accordance with some embodiments. The dielectric layer 116*a* may be made of or include silicon oxide, carbon-containing silicon oxide, silicon oxynitride, another suitable material, or a combination thereof. The dielectric layer 116*a* may be deposited using a chemical vapor deposition (CVD) process or the like. In some embodiments, before the formation of the dielectric layer 116*a*, one or more thermal operations are then performed to improve the quality of the device elements of the chip structures 102A.

Afterwards, one or more capacitor elements 118 are formed, as shown in FIG. 1B in accordance with some embodiments. The formation of the capacitor elements 118 will be illustrated in more detail later.

As shown in FIG. 1B, a dielectric layer 116*b* is then deposited over the capacitor elements 118, in accordance with some embodiments. The material and formation method of the dielectric layer 116*b* may be the same as or similar to those of the dielectric layer 116*a*.

Afterwards, multiple conductive bonding structures 122 are formed, as shown in FIG. 1B in accordance with some embodiments. In some embodiments, the conductive bonding structures 122 penetrate through the dielectric layers 116*a* and 116*b* and the capacitor elements 118. In some embodiments, the conductive bonding structures 122 are electrically connected to the conductive features 114. In some embodiments, some of the conductive bonding structures 122 and the capacitor elements 118 are electrically connected to each other.

In some embodiments, each of the conductive bonding structures 122 includes a metal bonding structure 120M and a conductive via 120V. The conductive via 120V is in direct contact with the metal bonding structure 120M. In some embodiments, the metal bonding structure 120M and the conductive via 120V are two linked portions of a single conductive structure that is formed in the same process.

In some embodiments, the top surfaces of the dielectric layer 116*b* and the metal bonding structures 120M are substantially coplanar, as shown in FIG. 1B. In some embodiments, the formation of the conductive bonding structures 122 involves one or more planarization processes, so as to ensure that top surfaces of the dielectric layer 116*b* and the metal bonding structures 120M are substantially coplanar. For example, a chemical mechanical polishing (CMP) process is used.

The dielectric layers 116*a* and 116*b* together form a dielectric bonding structure that laterally surrounds the conductive bonding structures 122 and the capacitor elements 118. In some embodiments, the capacitor elements 118 are positioned beside the conductive vias 120V. In some embodiments, the capacitor elements 118 are positioned between the metal bonding structures 120M and the bottom surfaces of the conductive vias 120V.

As mentioned above, in some embodiments, one or more thermal operations are then performed to improve the quality of the device elements of the chip structures 102A. Since the capacitor elements 118 over the dielectric layer 116*a* are formed after the thermal operations, the performance and reliability of the capacitor elements 118 may be prevented from being negatively affected by the thermal operations. Since the capacitor elements 118 are formed in the dielectric bonding structure, more available space for routing is thus obtained in the front-side interconnection portion 106. The performance of the chip structure 102A may be improved.

Figure 1C:
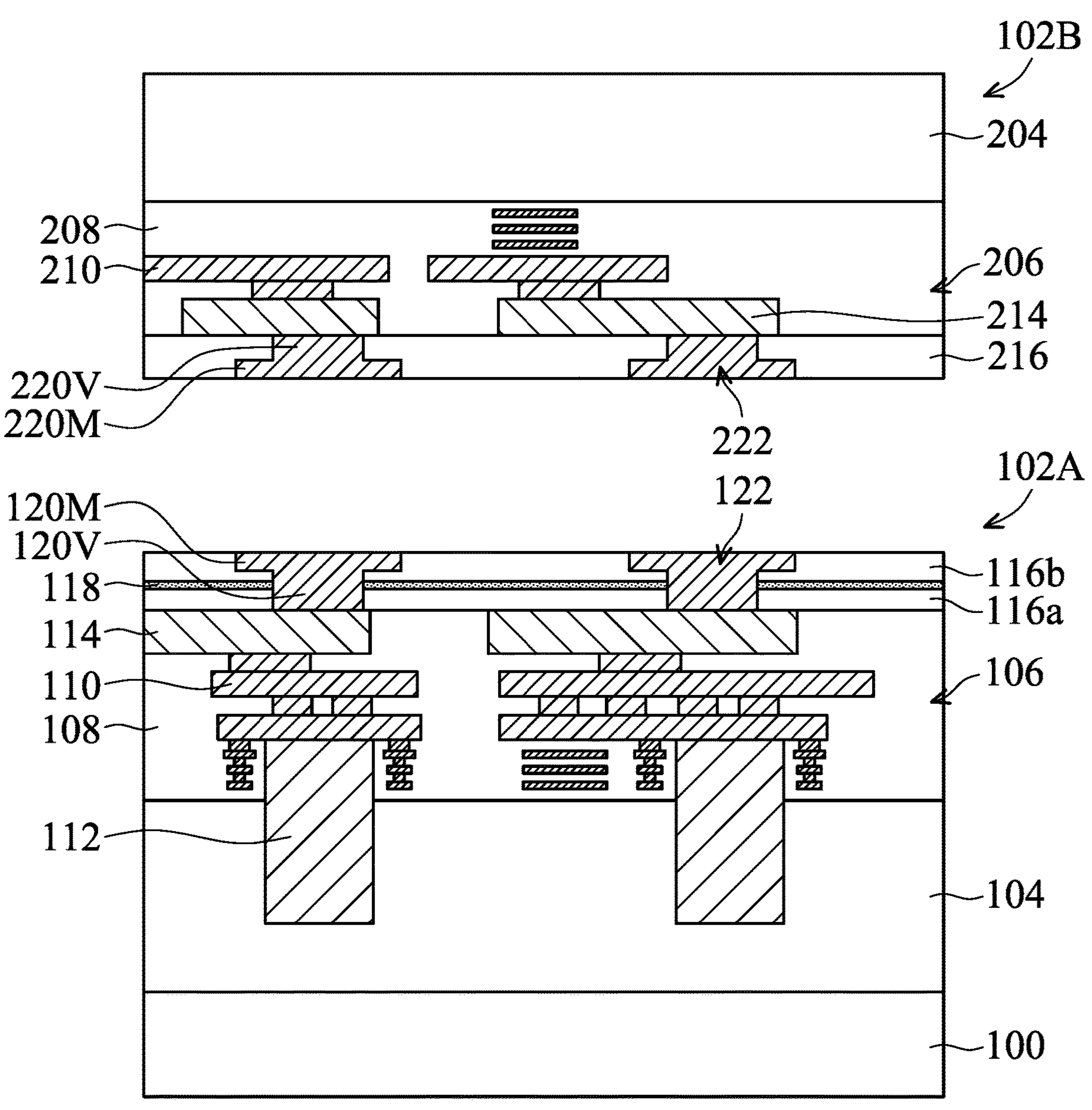

As shown in FIG. 1C, a chip structure (or a chip-containing structure) 102B is picked up and ready to be bonded to the chip structure 102A, in accordance with some embodiments. In some embodiments, the chip structure 102B is a semiconductor wafer that includes multiple semiconductor chips. After a sawing process, multiple semiconductor chips that are separated from each other may be obtained. In some other embodiments, the chip structure 102A is a single semiconductor chip.

In some embodiments, similar to the chip structure 102A, the chip structure 102B includes a semiconductor substrate 204 with multiple device elements formed therein or thereon. The chip structure 102B also includes a front-side interconnection portion 206. Similar to the front-side interconnection portion 106 of the chip structure 102A, the front-side interconnection portion 206 includes multiple dielectric layers 208 that laterally surround multiple conductive features 210 and 214. In some embodiments, each of the conductive features 214 is thicker than each of the conductive features 210.

In some embodiments, a dielectric bonding structure 216 and multiple conductive bonding structures 222 are formed on the front-side interconnection portion 206 of the chip structure 102B. Similar to the conductive bonding structures 122, in some embodiments, each of the conductive bonding structures 222 includes a metal bonding structure 220M and a conductive via 220V.

Figure 1D:
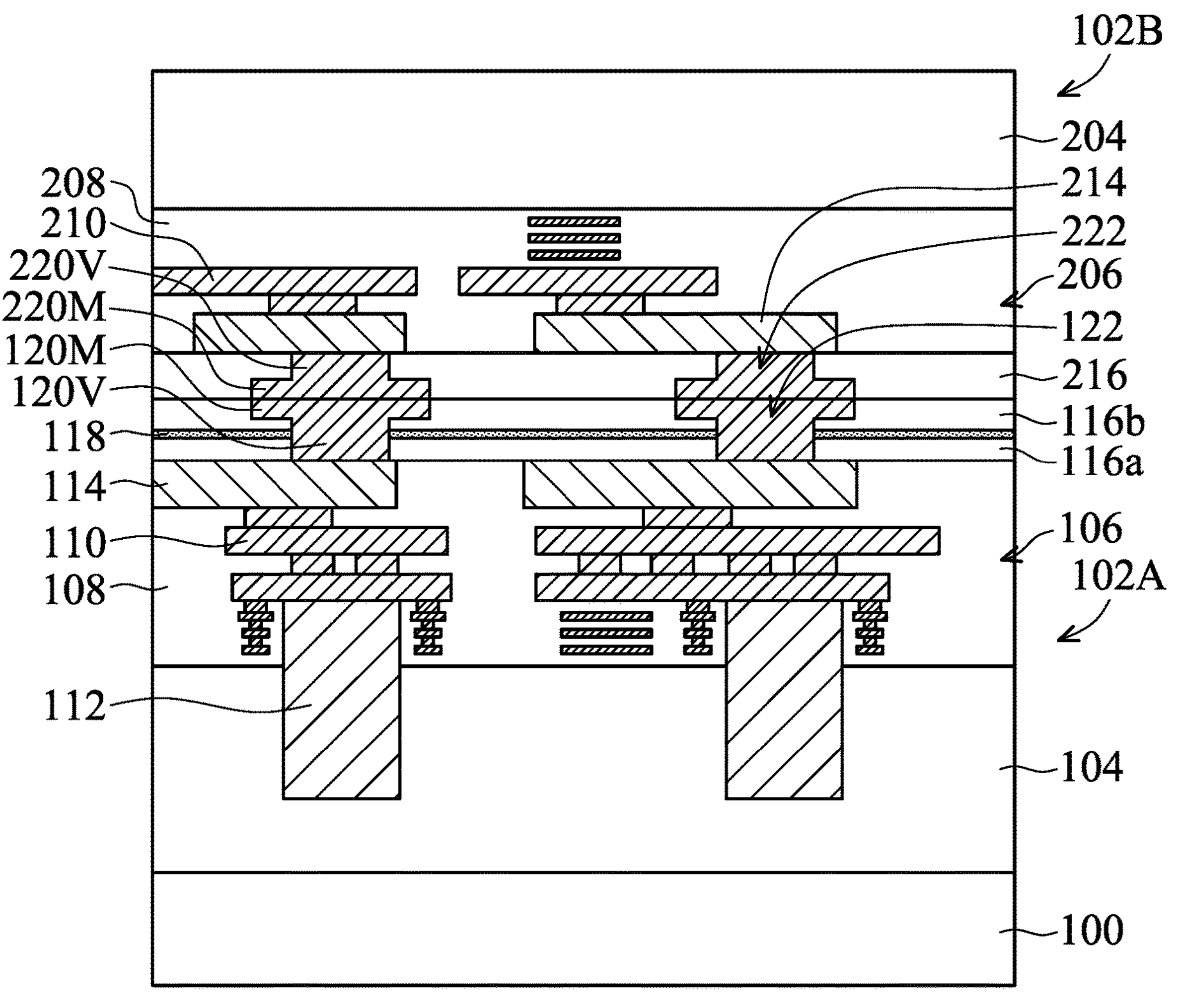

As shown in FIG. 1D, the chip structures 102A and 102B are bonded together through direct bonding, in accordance with some embodiments. The direct bonding may be a hybrid bonding that includes metal-to-metal bonding and dielectric-to-dielectric bonding. In some embodiments, there is no tin-containing solder elements formed between the chip structures 102A and 102B.

In some embodiments, the chip structure 102B is placed directly on the dielectric layer 116*b* and the conductive bonding structures 122. As a result, the dielectric layer 116*b* of the chip structure 102A is in direct contact with the dielectric bonding structure 216 of the chip structure 102B. The conductive bonding structures 122 of the chip structure 102A are in direct contact with the conductive bonding structures 222 of the chip structure 102B.

Before the placing of the chip structure 102B, planarization processes are performed, so as to provide highly planarized bonding surfaces. In some embodiments, there is no gap between the dielectric layer 116*b* and the dielectric bonding structure 216. In some embodiments, there is no gap between the conductive bonding structures 122 and 222. In some embodiments, a thermal operation is then used to enhance the bonding between the conductive bonding structures 122 and 222. The temperature of the thermal operation may within a range from about 100 degrees C. to about 500 degrees C.

Figure 1E:
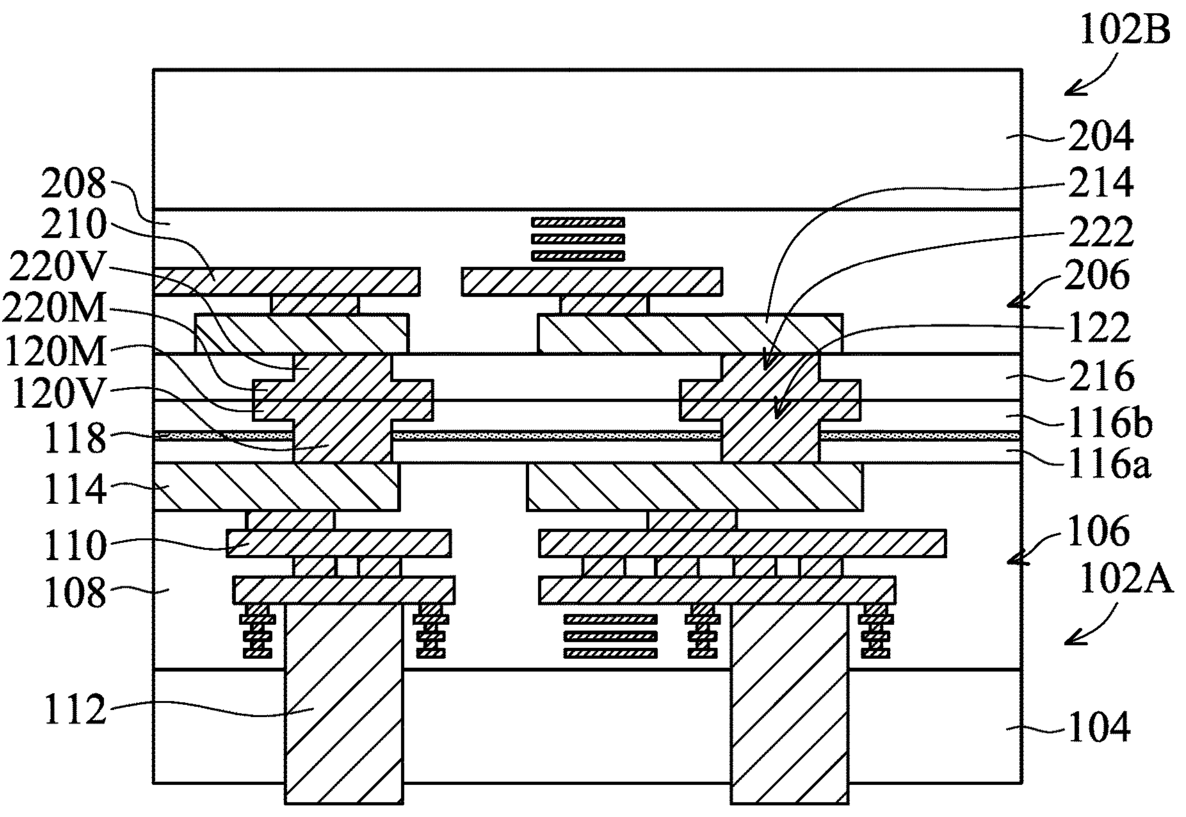

As shown in FIG. 1E, the carrier substrate 100 is removed, in accordance with some embodiments. The chip structure 102A is then thinned using a planarization process. The planarization process may include a CMP process, a grinding process, an etching process, another applicable process, or a combination thereof. As a result, the through-chip vias 112 that are originally covered by the semiconductor substrate 104 are exposed. In some embodiments, the through-chip vias 112 protrude from the bottom surface of the chip structure 102A.

Figure 1F:
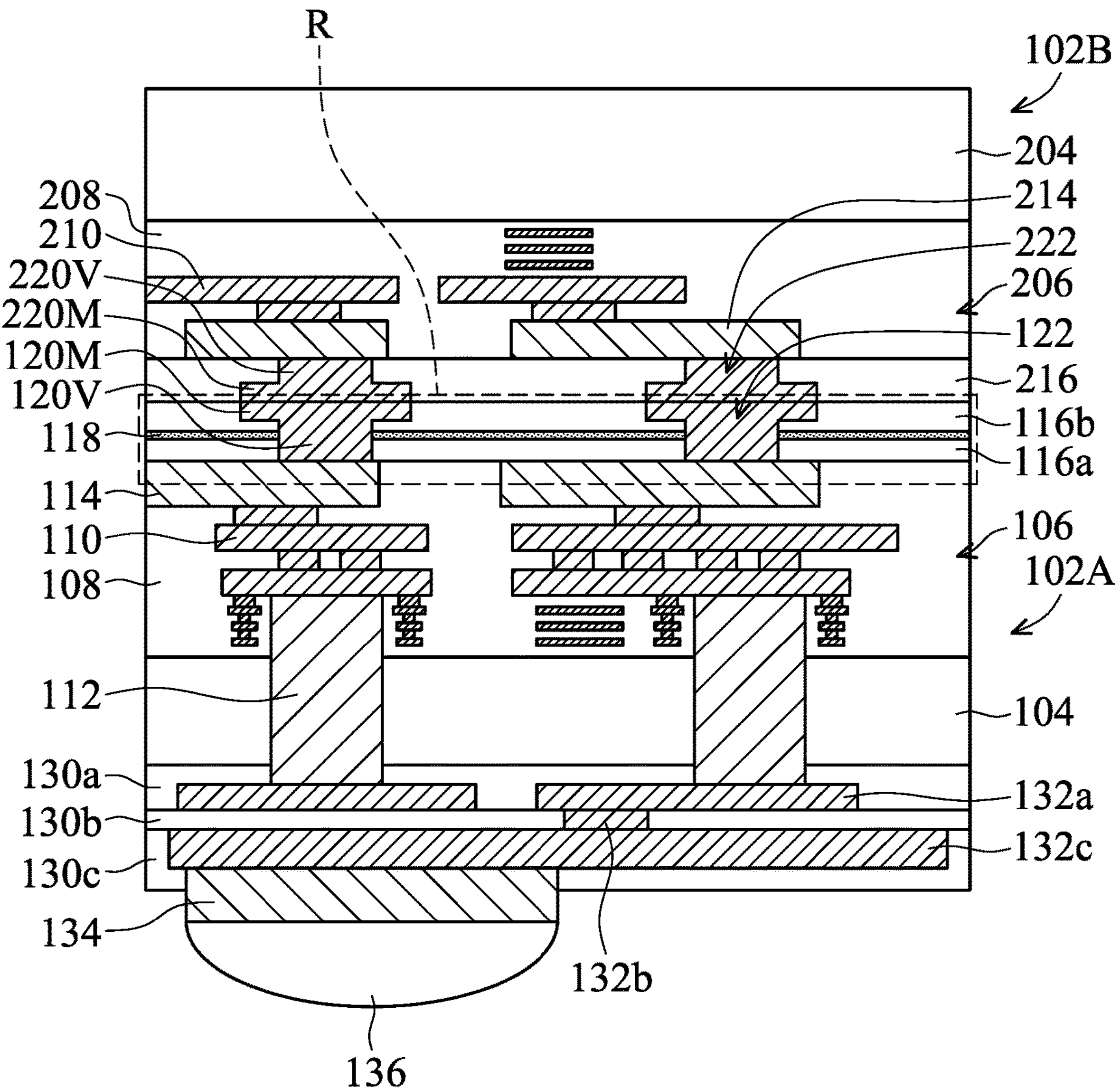

As shown in FIG. 1F, a redistribution structure that includes multiple insulating layers 130*a*, 130*b*, and 130*c* and multiple conductive features 132*a*, 132*b*, and 132*c* are formed over the semiconductor substrate 104 and the through-chip vias 112, in accordance with some embodiments. The formation of the redistribution structure may involve multiple film formation processes, multiple patterning processes, multiple planarization processes, another applicable process, or a combination thereof.

The insulating layers 130*a*-130*c* may be made of or include a polymer material. The polymer material may be made of or include polybenzoxazole (PBO), polyimide, epoxy-based resin, another suitable polymer material, or a combination thereof. In some other embodiments, the insulating layer 130*a*-130*c* are made of or include silicon nitride, silicon oxide, silicon oxynitride, silicon carbide, another suitable dielectric material, or a combination thereof. In some embodiments, the formation of each of the insulating layer 130*a*-130*c* involves a spin-on process, a spray coating process, a chemical vapor deposition (CVD) process, another applicable process, or a combination thereof.

The conductive features 132*a*-132*c* may be made of or include copper, titanium, aluminum, gold, platinum, cobalt, tungsten, another suitable material, or a combination thereof. The formation of each of the conductive features 132*a*-132*c* may involve using an electroplating process, an electrochemical plating process, a CVD process, a physical vapor deposition (PVD) process, another applicable process, or a combination thereof.

Afterwards, an under bump metallization (UBM) structure 134 and a conductive bump 136 are formed, as shown in FIG. 1F in accordance with some embodiments. The conductive bump 136 may include a solder material. The solder material may be a tin-containing material. The tin-containing material may further include copper, silver, gold, aluminum, lead, one or more other suitable materials, or a combination thereof. In some other embodiments, the solder material is lead-free.

In some embodiments, a sawing process is used to separate the structure into multiple package structures. One of the package structures is shown in FIG. 1F. The package structure may function as a system on integrated chips (SoIC) that may further be integrated into another package.

The package may include multiple chip structures bonded to an interposer substrate that is further bonded to another substrate. Alternatively, the package may include multiple chip structures surrounded by a protective layer and a redistribution structure formed on the chip structures and the protective layer.

In some embodiments, the capacitor elements 118 are formed around the conductive vias of the conductive bonding structures 122 of a single chip structure (such as the chip structure 102A), as shown in FIG. 1F. However, embodiments of the disclosure are not limited thereto. Many variations and/or modifications can be made to embodiments of the disclosure.

Figure 2:
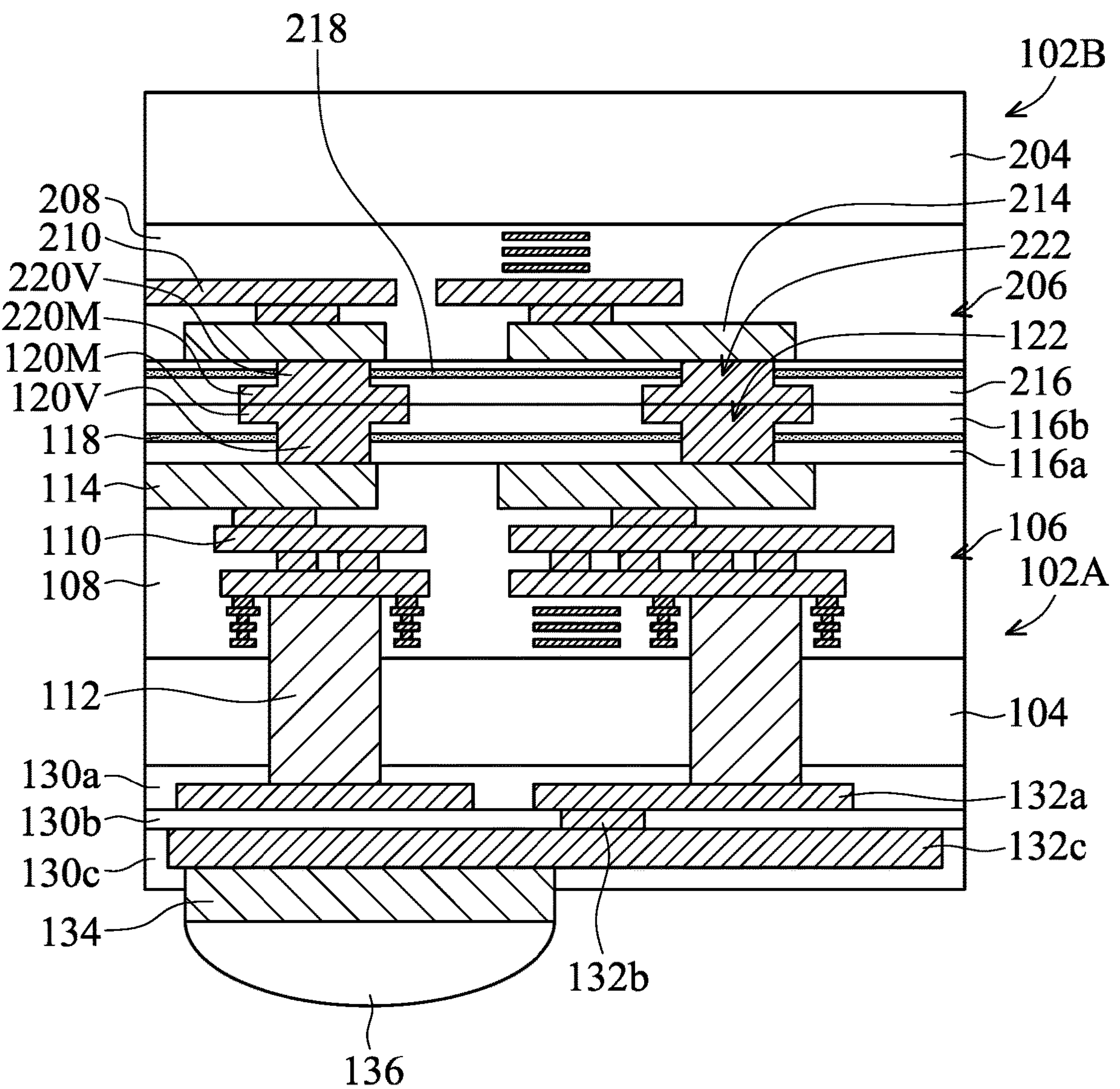
FIG. 2 is a cross-sectional view of a portion of a package structure, in accordance with some embodiments.

FIG. 2 is a cross-sectional view of a portion of a package structure, in accordance with some embodiments. In some embodiments, one or more capacitor elements 218 are formed. The capacitor elements 218 are positioned beside the conductive vias of the conductive bonding structures 222. The capacitor elements 218 are laterally surrounded by the dielectric bonding structure 216. In some embodiments, some of the capacitor elements 218 and the conductive bonding structures 222 are electrically connected to each other. The formation of the capacitor elements 218 will be illustrated in more detail later.

FIGS. 3A-3I are cross-sectional views of various stages of a process for forming a portion of a package structure, in accordance with some embodiments. FIGS. 3A-3I show the formation of the capacitor elements 118. In some embodiments, FIGS. 3A-3I show the formation of the capacitor elements 118 near the region R in FIG. 1F. In some embodiments, the formation method of the capacitor elements 118 illustrated in FIGS. 3A-3I is used for forming the capacitor elements 218 shown in FIG. 2.

Figure 3A:
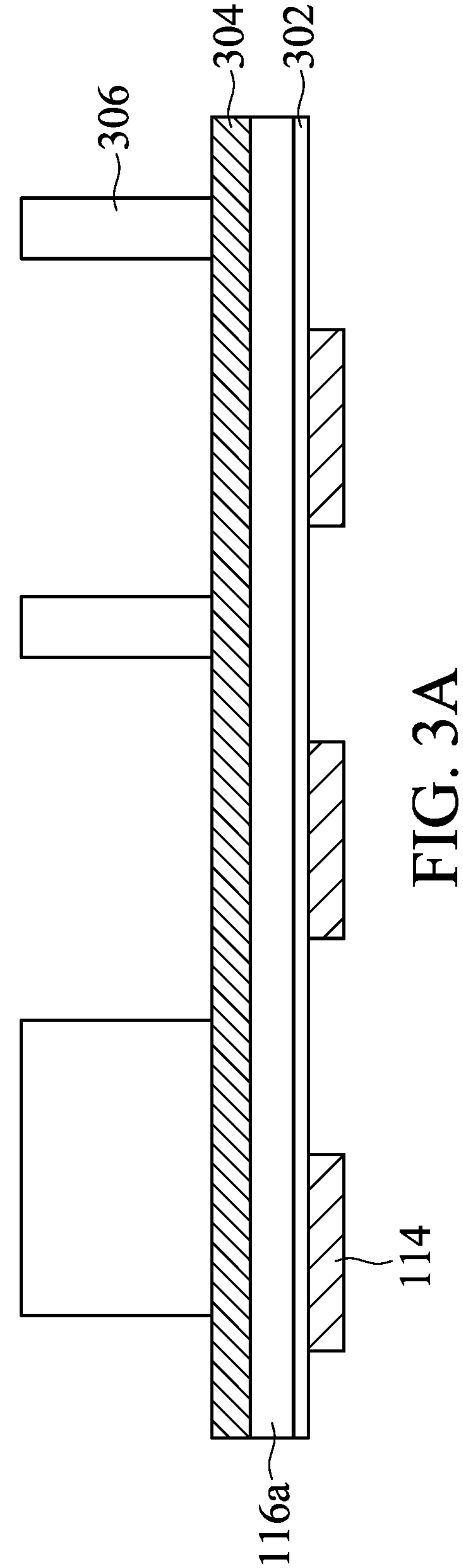
FIGS. 3A-3I are cross-sectional views of various stages of a process for forming a portion of a package structure, in accordance with some embodiments.

As shown in FIG. 3A, an etch stop layer 302 and a dielectric layer 116*a* are formed over the conductive features 114, in accordance with some embodiments. The etch stop layer 302 may be made of or include silicon nitride, silicon oxynitride, another suitable material, or a combination thereof. The etch stop layer 302 may be deposited using a CVD process or the like. The material and formation method of the dielectric layer 116*a* may be the same as or similar to those of the dielectric layer 116*a* illustrated in FIG. 1B.

Afterwards, a capacitor electrode layer 304 is formed over the dielectric layer 116*a*, as shown in FIG. 3A in accordance with some embodiments. The capacitor electrode layer 304 may be made of or include titanium nitride, tantalum nitride, copper, aluminum, tungsten, cobalt, another suitable material, or a combination thereof. The capacitor electrode layer 304 may be formed using an electroplating process, an electrochemical plating process, a PVD process, a CVD process, another applicable process, or a combination thereof.

As shown in FIG. 3A, a patterned mask element 306 is formed over the capacitor electrode layer 304, in accordance with some embodiments. The patterned mask element 306 has multiple openings that partially expose the capacitor electrode layer 304. In some embodiments, the patterned mask element 306 is a patterned photoresist layer.

Figure 3B:
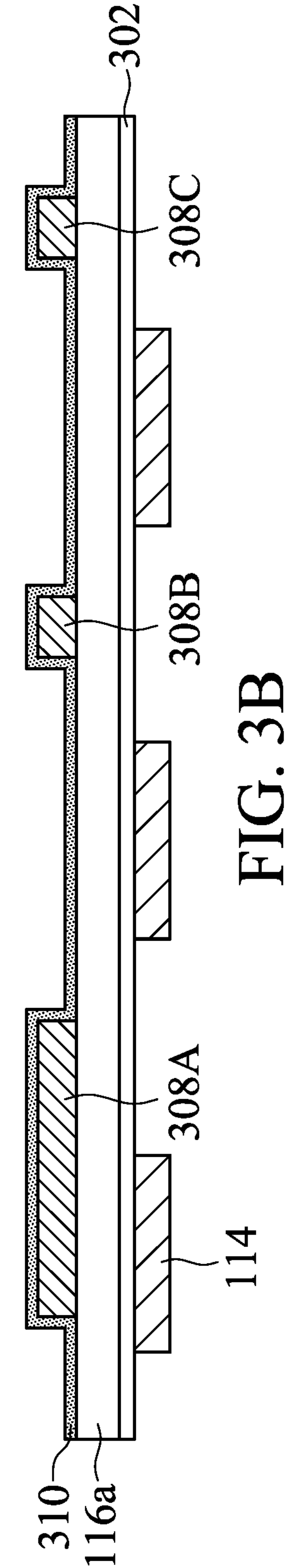

As shown in FIG. 3B, the capacitor electrode layer 304 is patterned to form multiple capacitor electrodes 308A, 308B, and 308C, in accordance with some embodiments. In some embodiments, with the patterned mask element 306 as an etching mask, one or more etching processes are used to partially remove the capacitor electrode layer 304. As a result, the remaining portions of the capacitor electrode layer 304 form the capacitor electrodes 308A-308C. After the formation of the capacitor electrodes 308A-308C, the patterned mask element 306 is removed.

Afterward, a capacitor dielectric layer 310 is formed over the dielectric layer 116*a* and the capacitor electrodes 308A-308C, as shown in FIG. 3B in accordance with some embodiments. The capacitor dielectric layer 310 extends along the sidewalls and tops of the capacitor electrodes 308A-308C.

The capacitor dielectric layer 310 may be made of or include hafnium zirconium oxide, zirconium oxide, aluminum oxide, hafnium oxide, zirconium titanium oxide, titanium oxide, tantalum oxide, strontium titanium oxide, barium titanium oxide, barium strontium titanium oxide, lead zirconium titanium oxide, another suitable material, or a combination thereof. The capacitor dielectric layer 310 may be formed using a CVD process, an atomic layer deposition (ALD) process, a spin-coating process, another applicable process, or a combination thereof.

In some embodiments, the capacitor dielectric layer 310 is a single layer. In some other embodiments, the capacitor dielectric layer 310 includes multiple sub-layers. In some embodiments, some of the sub-layers are made of different materials.

Figure 3C:
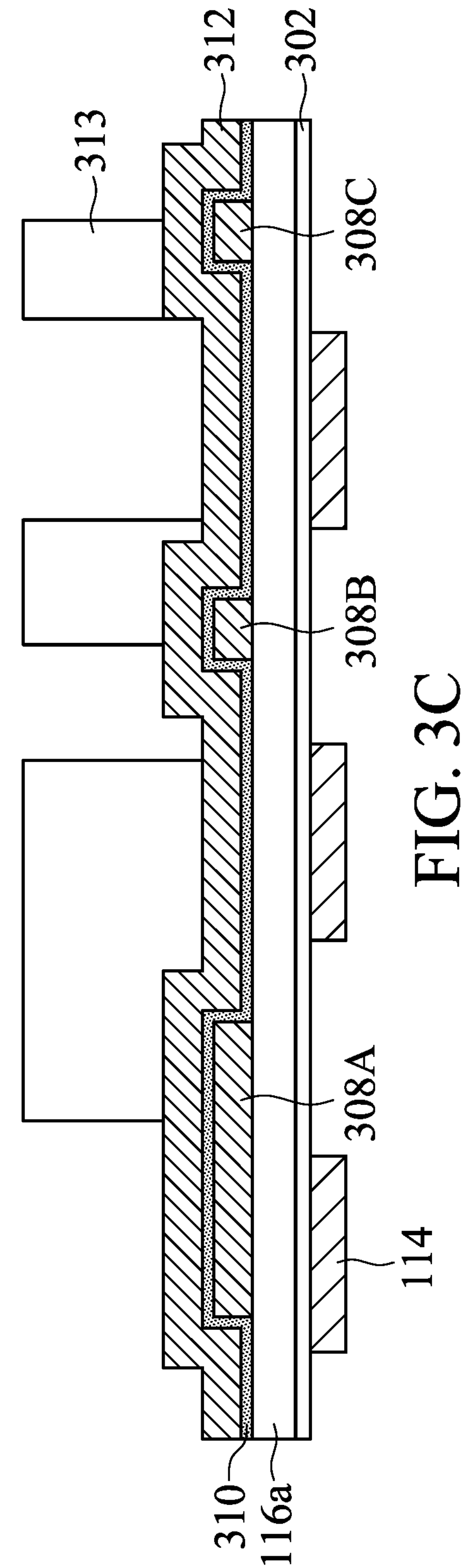

As shown in FIG. 3C, a capacitor electrode layer 312 is formed over the capacitor dielectric layer 310, in accordance with some embodiments. The material and formation method of the capacitor electrode layer 312 may be the same as or similar to those of the capacitor electrode layer 304.

Afterwards, a patterned mask element 313 is formed over the capacitor electrode layer 312, as shown in FIG. 3C in accordance with some embodiments. The patterned mask element 313 has multiple openings that partially expose the capacitor electrode layer 312. In some embodiments, the patterned mask element 313 is a patterned photoresist layer.

Figure 3D:
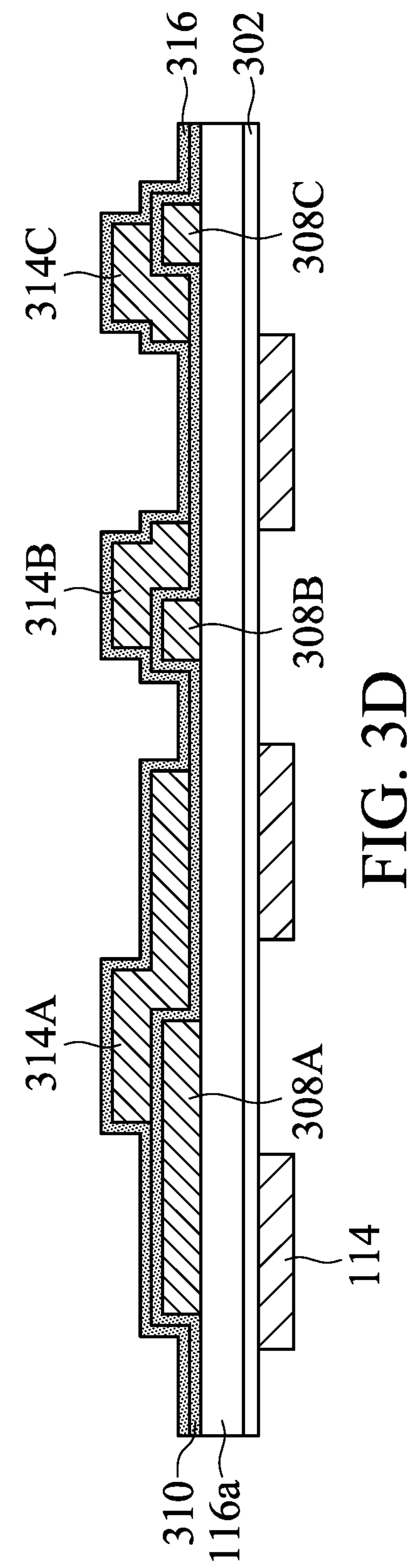

As shown in FIG. 3D, the capacitor electrode layer 312 is patterned to form multiple capacitor electrodes 314A, 314B, and 314C, in accordance with some embodiments. In some embodiments, with the patterned mask element 313 as an etching mask, one or more etching processes are used to partially remove the capacitor electrode layer 312. As a result, the remaining portions of the capacitor electrode layer 312 form the capacitor electrodes 314A-314C. After the formation of the capacitor electrodes 314A-314C, the patterned mask element 313 is removed.

Afterward, a capacitor dielectric layer 316 is formed over the capacitor dielectric layer 310 and the capacitor electrodes 314A-314C, as shown in FIG. 3D in accordance with some embodiments. The capacitor dielectric layer 316 extends along the sidewalls and tops of the capacitor electrodes 314A-314C. In some embodiments, the capacitor dielectric layer 316 is in direct contact with the capacitor dielectric layer 310.

The material and formation method of the capacitor dielectric layer 316 may be the same as or similar to those of the capacitor dielectric layer 310. In some embodiments, the capacitor dielectric layers 316 and 310 are made of the same material. In some other embodiments, the capacitor dielectric layers 316 and 310 are made of different materials.

In some embodiments, the capacitor dielectric layer 316 is a single layer. In some other embodiments, the capacitor dielectric layer 316 includes multiple sub-layers. In some embodiments, some of the sub-layers are made of different materials.

Figures 3E, 3F:
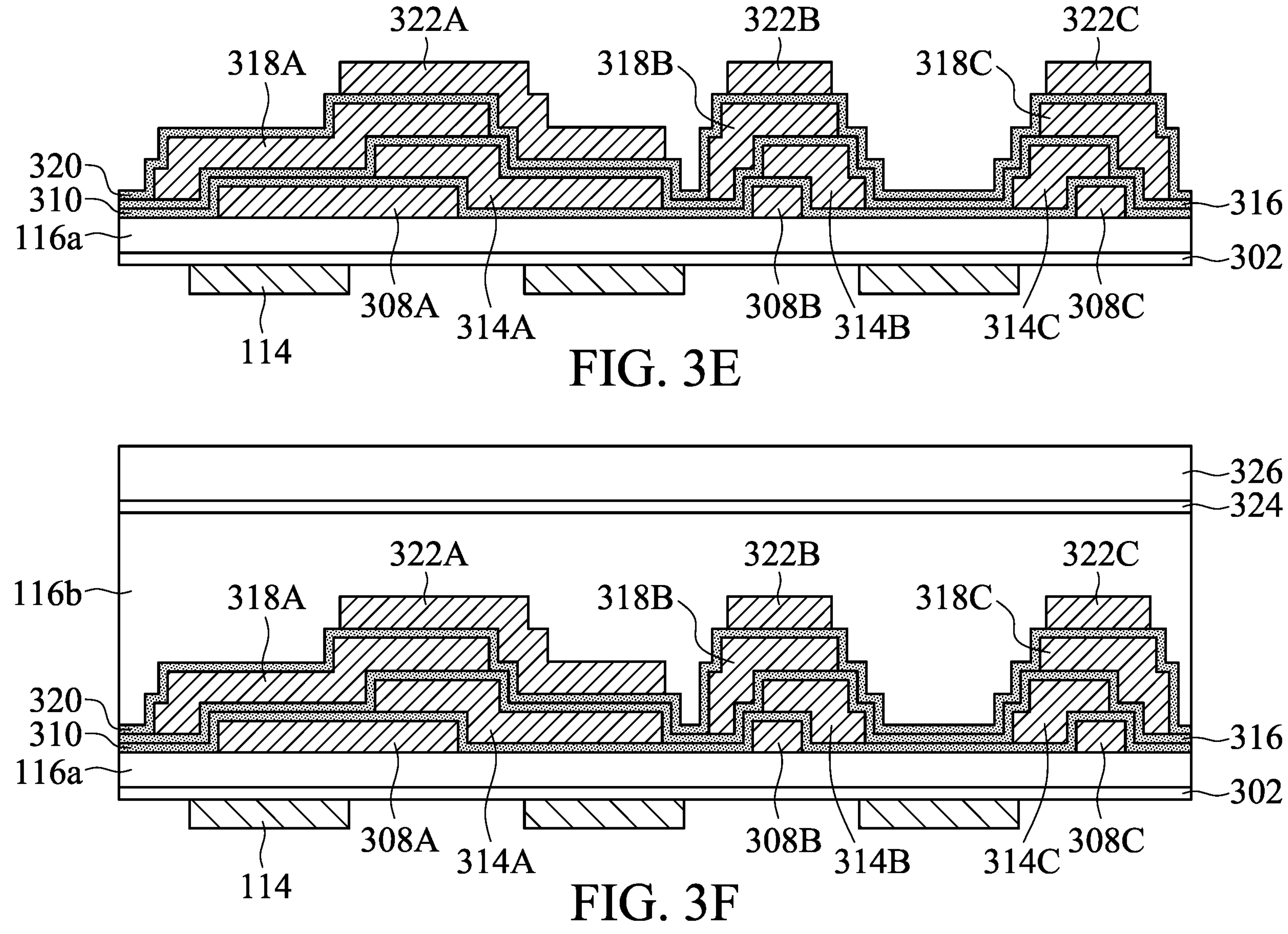

As shown in FIG. 3E, capacitor electrodes 318A, 318B, and 318C, a capacitor dielectric layer 320, and capacitor electrodes 322A, 322B, and 322C are formed, in accordance with some embodiments. The material and formation method of the capacitor electrodes 318A-318C and 322A-322C may be the same as or similar to those of the capacitor electrodes 308A-308C and 314A-314C. The material and formation method of the capacitor dielectric layer 320 may be the same as or similar to those of the capacitor dielectric layers 310 and 316. In some embodiments, a portion of the capacitor electrode 314A is positioned between the capacitor electrodes 308A and 318A, as shown in FIG. 3E. In some embodiments, a portion of the capacitor electrode 318A is positioned between the capacitor electrodes 314A and 322A, as shown in FIG. 3E.

As shown in FIG. 3F, a dielectric layer 116*b*, an etch stop layer 324, and a dielectric layer 326 are sequentially deposited over the structure shown in FIG. 3E, in accordance with some embodiments. The material and formation method of the dielectric layers 116*b* and 326 may be the same as or similar to those of the dielectric layer 116*a*. The material and formation method of the etch stop layer 324 may be the same as or similar to those of the etch stop layer 302.

Figure 3G:
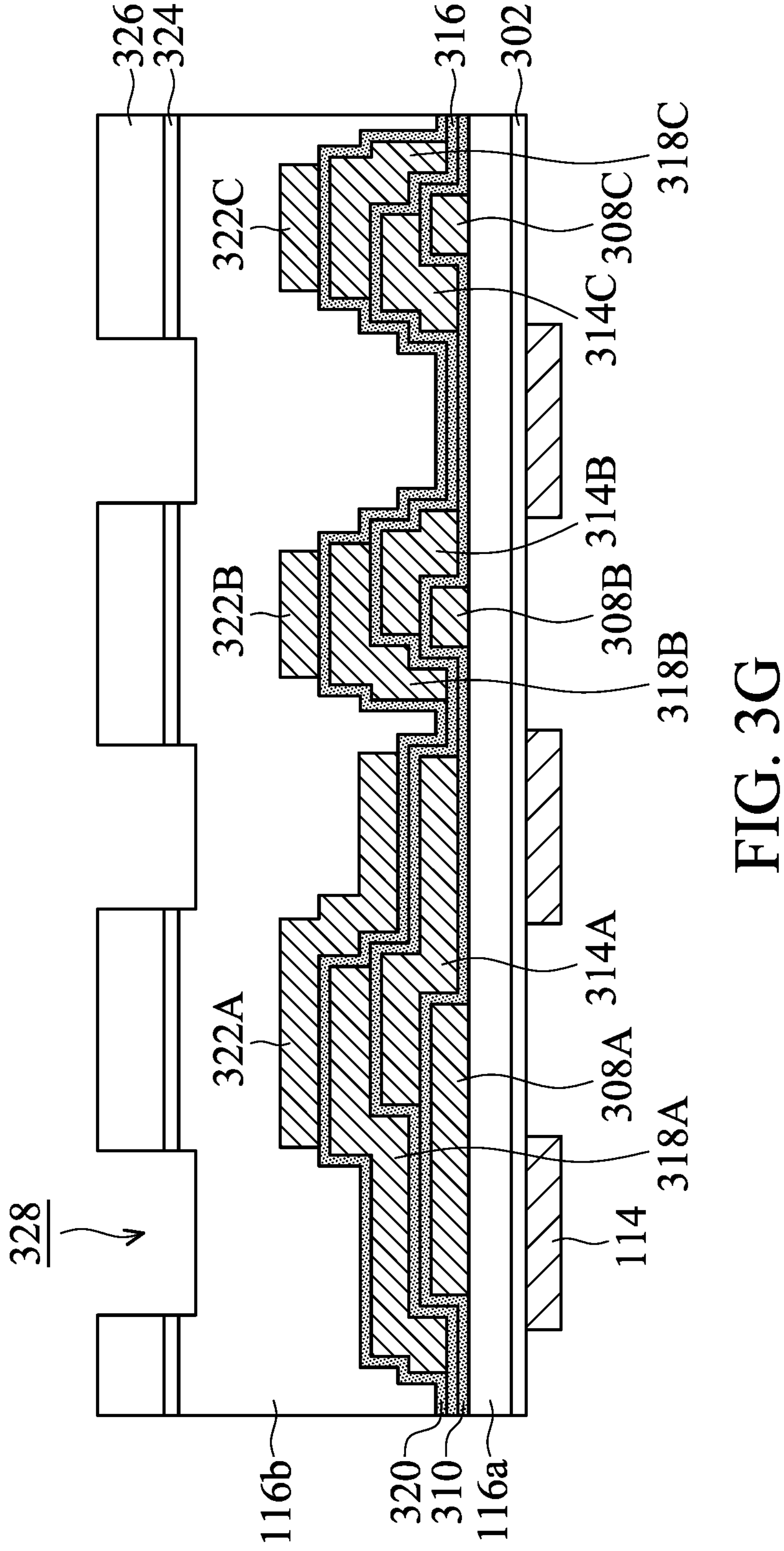

As shown in FIG. 3G, the dielectric layer 326 and the etch stop layer 324 are partially removed, in accordance with some embodiments. As a result, multiple openings 328 are formed. One or more photolithography processes and one or more etching processes may be used to form the openings 328. In some embodiments, the openings 328 are trenches. In some embodiments, the openings 328 slightly extend into the dielectric layer 116*b*.

Figure 3H:
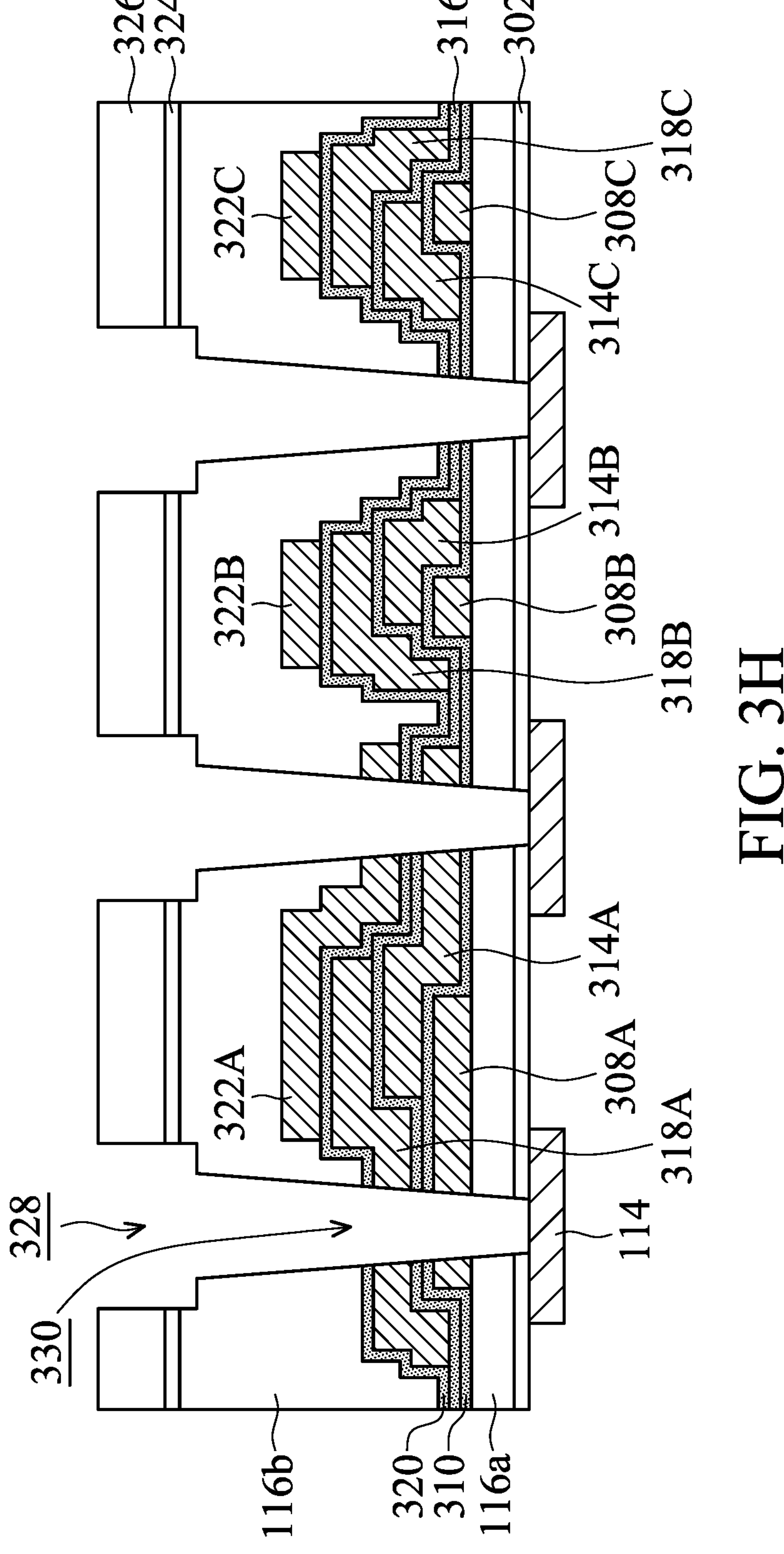

As shown in FIG. 3H, the dielectric layers 116*b* and 116*a*, the capacitor electrodes 308A-308C, 314A-314C, 318A-318C, and 322A-322C, the capacitor dielectric layers 310, 316, and 320, and the etch stop layer 302 are partially removed, in accordance with some embodiments. As a result, multiple via holes 330 are formed. One or more photolithography processes and one or more etching processes may be used to form the via holes 330. The via holes 330 expose the conductive features 114. In some embodiments, the via holes 330 are formed simultaneously using the same etching process. In some embodiments, the via holes 330 and the openings 328 together expose the sidewalls of the capacitor electrodes 308A, 314A, and 322A, as shown in FIG. 3H.

Figure 3I:
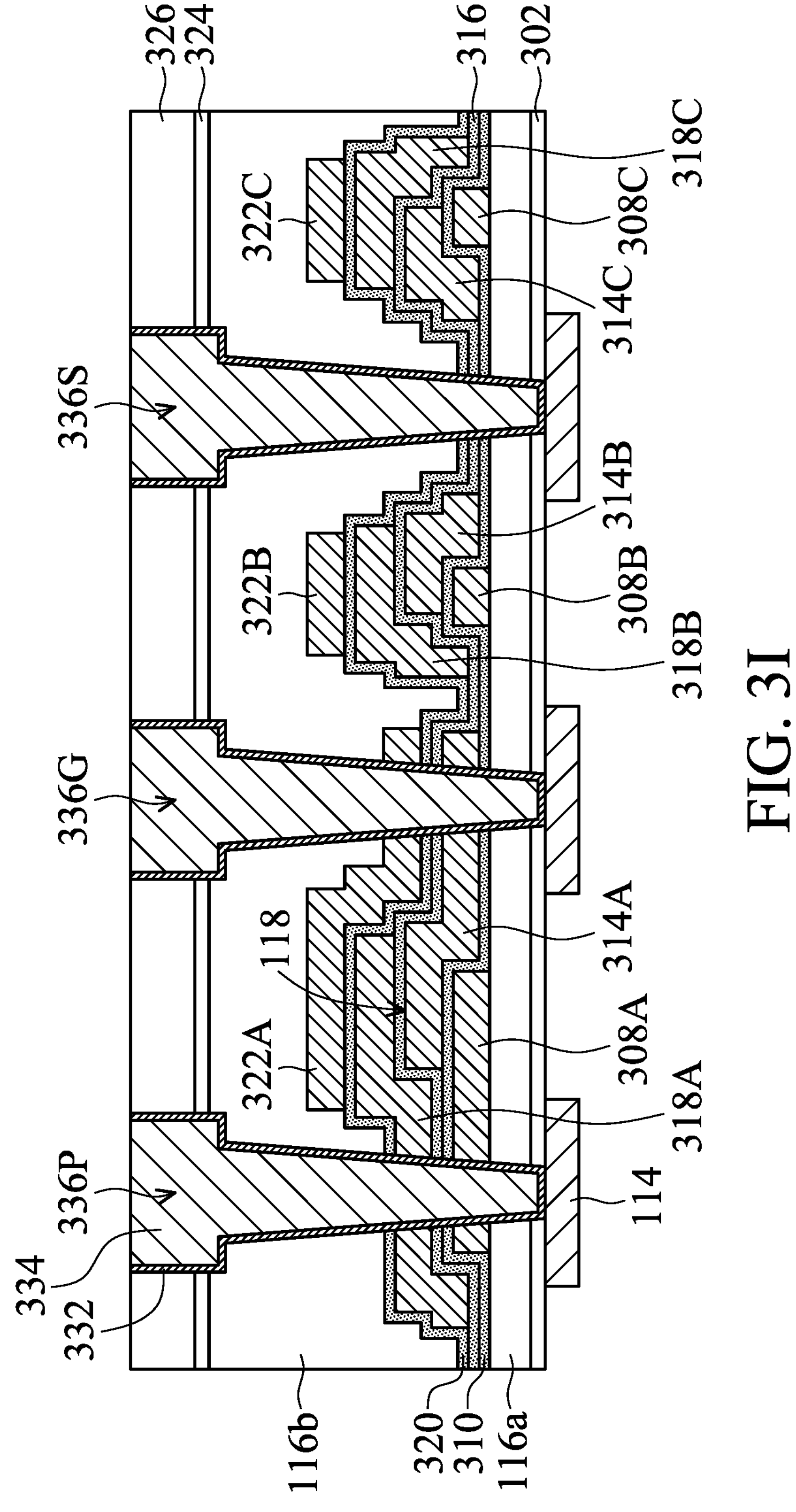

As shown in FIG. 3I, conductive bonding structures 336P, 336G, and 336S are formed in the openings 328 and the via holes 330, in accordance with some embodiments. Each of the conductive bonding structures 336P, 336G, and 336S may be function as the conductive bonding structures 122 shown in FIGS. 1F and 2. Each of the conductive bonding structures 336P, 336G, and 336S may be function as the conductive bonding structures 222 shown in FIG. 2. In some embodiments, the conductive bonding structures 336P, 336G, and 336S are formed simultaneously.

In some embodiments, each of the conductive bonding structures 336P, 336G, and 336S includes a barrier layer 332 and a conductive filling 334, as shown in FIG. 3I. The barrier layer 332 may be made of or include titanium nitride, tantalum nitride, another suitable material, or a combination thereof. The barrier layer 332 may be deposited using a CVD process, an ALD process, a PVD process, another applicable process, or a combination thereof.

The conductive filling 334 may be made of or include copper, tungsten, aluminum, cobalt, another suitable material, or a combination thereof. In some embodiments, after the formation of the barrier layer 332, a conductive material layer is formed to overfill the openings 328 and the via holes 330.

The conductive material layer may be formed using an electroplating process, an electrochemical plating process, a CVD process, an ALD process, a flowable chemical vapor deposition (FCVD) process, a PVD process, another applicable process, or a combination thereof. Afterwards, a planarization process (such as a CMP process) is performed to remove the portions of the conductive material layer that are outside of the openings 328 and the via holes 330. As a result, the remaining portions of the conductive material layer form the conductive fillings 334, as shown in FIG. 3I. During the planarization process, the portions of the barrier layer 332, that are outside of the openings 328 and the via holes 330, are also removed. The planarization process may help to provide a highly-planarized bonding surface, which facilitates the subsequent bonding process with another chip structure.

As shown in FIG. 3I, the capacitor elements 118 are formed, in accordance with some embodiments. In some embodiments, the conductive bonding structures 336P and 336G are used to provide electrical connection to power and ground, respectively. In some embodiments, the conductive bonding structure 336P is electrically connected to the capacitor electrodes 308A and 318A. In some embodiments, the conductive bonding structure 336P is in direct contact with the sidewalls of the capacitor electrodes 308A and 318A. In some embodiments, the conductive bonding structure 336G is electrically connected to the capacitor electrodes 314A and 322A. In some embodiments, the conductive bonding structure 336G is in direct contact with the sidewalls of the capacitor electrodes 314A and 322A.

In some embodiments, the conductive bonding structure 336S is used to provide electrical connection to signal net of the chip structure 102A. In some embodiments, the conductive bonding structure 336S penetrates through the capacitor dielectric layers 310, 316, and 320, as shown in FIG. 3I. In some embodiments, the conductive bonding structure 336S is in direct contact with the capacitor dielectric layers 310, 316, and 320. In some embodiments, the conductive bonding structure 336S is electrically isolated from the capacitor electrodes 308A-308C, 314A-314C, and 322A-322C.

Figure 4:
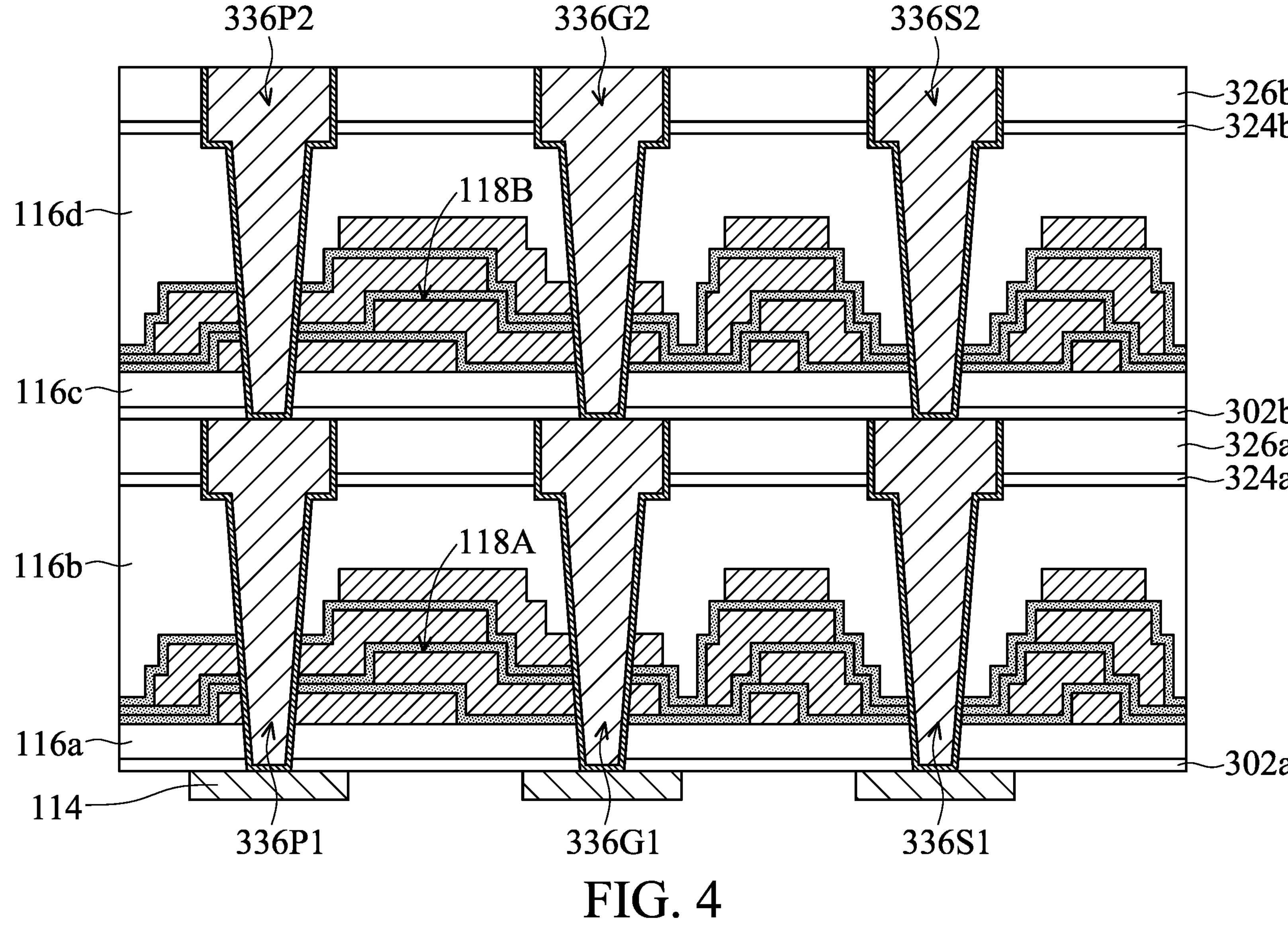
FIG. 4 is a cross-sectional view of a portion of a package structure, in accordance with some embodiments.

Many variations and/or modifications can be made to embodiments of the disclosure. FIG. 4 is a cross-sectional view of a portion of a package structure, in accordance with some embodiments. In some embodiments, more capacitor elements including capacitor elements 118A and 118B are formed.

In some embodiments, the processes used for forming the structure shown in FIG. 3I are performed two or more times. As a result, the structure shown in FIG. 4 is formed. Similar to the embodiments shown in FIG. 3I, the structure shown in FIG. 4 includes etch stop layers 302*a*, 302*b*, 324*a*, and 324*b*, dielectric layers 106*a*, 106*b*, 106*c*, 106*d*, 326*a*, and 326*b*, capacitor elements 118A and 118*b*, and conductive bonding structures 336P1, 336P2, 336G1, 336G2, 336S1, and 336S2.

Many variations and/or modifications can be made to embodiments of the disclosure. FIGS. 5A-5I are cross-sectional views of various stages of a process for forming a portion of a package structure, in accordance with some embodiments.

FIGS. 5A-5I show the formation of capacitor elements 518. In some embodiments, the formation method of the capacitor elements 518 illustrated in FIGS. 5A-5I is used for forming the capacitor elements 118 near the region R in FIG. 1H. In some embodiments, the formation method of the capacitor elements 518 illustrated in FIGS. 5A-5I is used for forming the capacitor elements 218 shown in FIG. 2

Figures 5A, 5B:
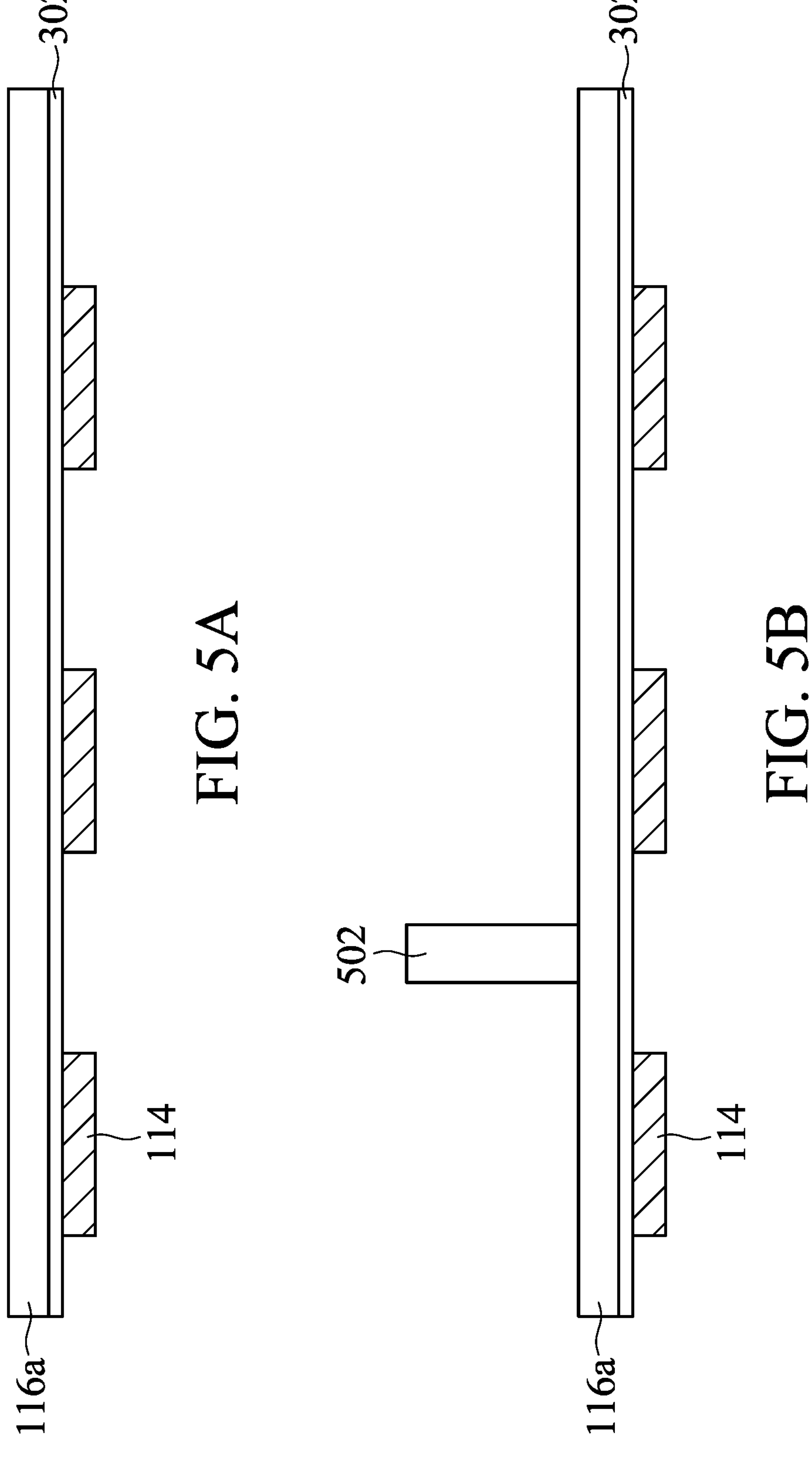
FIGS. 5A-5I are cross-sectional views of various stages of a process for forming a portion of a package structure, in accordance with some embodiments.

As shown in FIG. 5A, similar to the embodiments shown in FIG. 3A, an etch stop layer 302 and a dielectric layer 116*a* are formed over the conductive features 114, in accordance with some embodiments.

As shown in FIG. 5B, a protruding structure 502 is formed over the dielectric layer 116*a*, in accordance with some embodiments. The protruding structure 502 may be made of a dielectric material. The protruding structure 502 may be made of silicon oxide, silicon nitride, silicon oxynitride, another suitable material, or a combination thereof. A dielectric material layer may be deposited over the dielectric layer 116*a*. Afterwards, the dielectric material layer is partially removed. As a result, a remaining portion of the dielectric material layer forms the protruding structure 502.

Figures 5C, 5D:
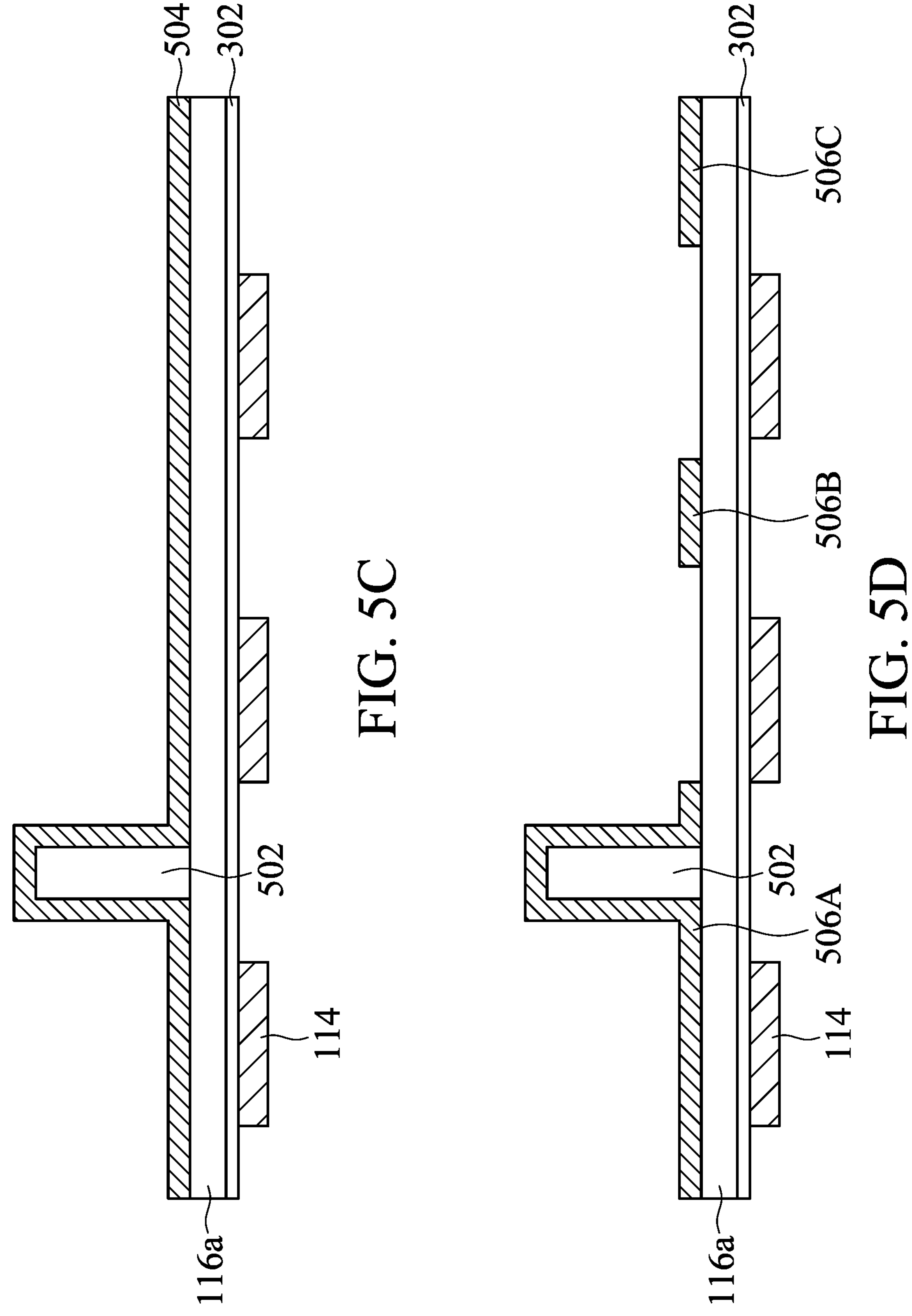

As shown in FIG. 5C, a capacitor electrode layer 504 is formed over the dielectric layer 116*a* and the protruding structure 502, in accordance with some embodiments. The capacitor electrode layer 504 extends along the sidewalls and the top of the protruding structure 502. The material and formation method of the capacitor electrode layer 504 may be the same as or similar to those of the capacitor electrode layer 304.

As shown in FIG. 5D, the capacitor electrode layer 504 is partially removed, in accordance with some embodiments. One or more photolithography processes and one or more etching processes may be used to partially remove the capacitor electrode layer 504. As a result, the remaining portions of the capacitor electrode layer 504 form multiple capacitor electrodes 506A, 506B, and 506C, as shown in FIG. 5D.

Figures 5E, 5F:
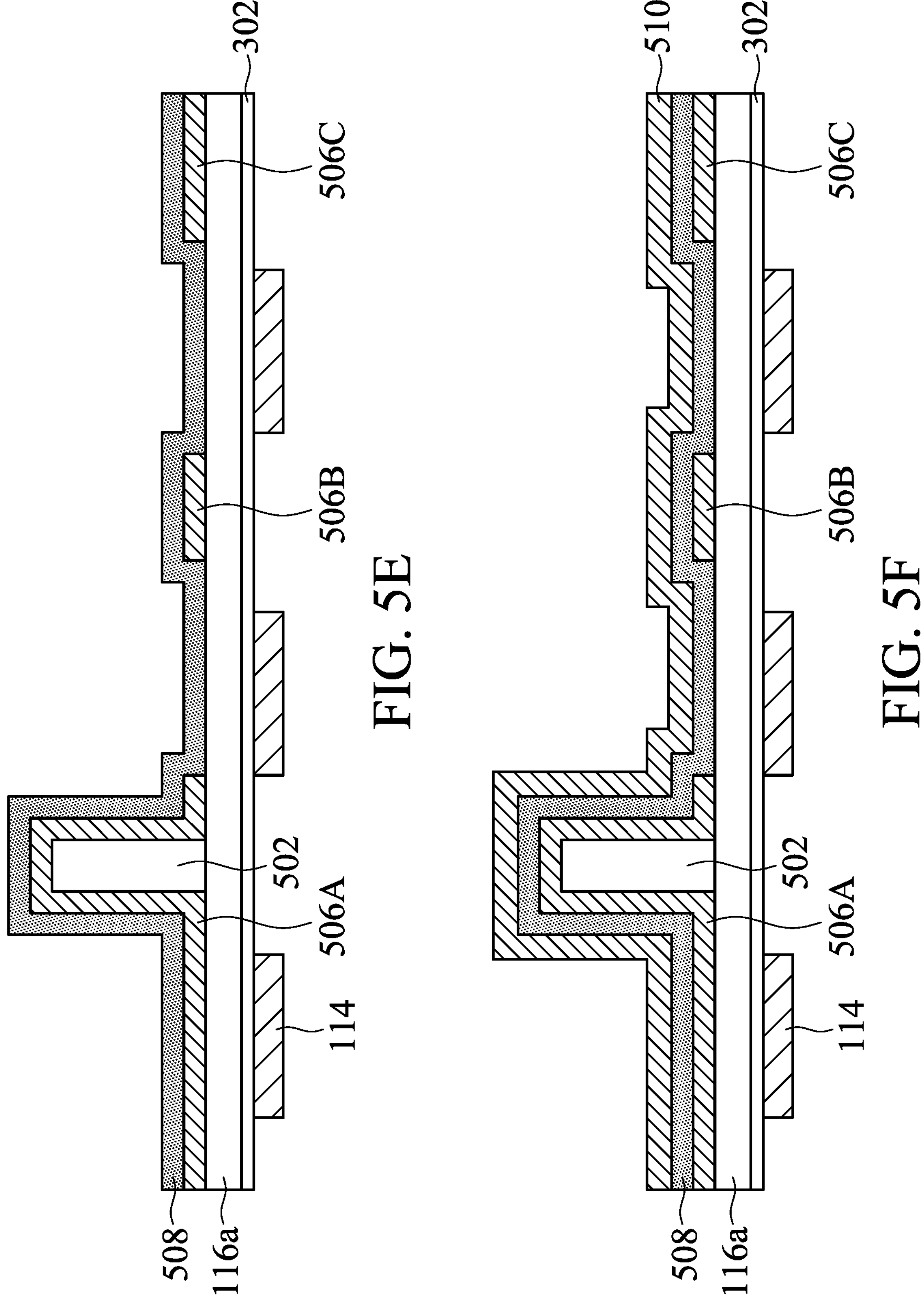

As shown in FIG. 5E, a capacitor dielectric layer 508 is formed over the capacitor electrodes 506A-506C and the dielectric layer 116*a*, in accordance with some embodiments. The material and formation method of the capacitor dielectric layer 508 may be the same as or similar to those of the capacitor dielectric layer 310. In some embodiments, the capacitor dielectric layer 508 is a single layer. In some other embodiments, the capacitor dielectric layer 508 includes multiple sub-layers. In some embodiments, some of the sub-layers are made of different materials.

As shown in FIG. 5F, a capacitor electrode layer 510 is formed over the capacitor dielectric layer 508, in accordance with some embodiments. The material and formation method of the capacitor electrode layer 510 may be the same as or similar to those of the capacitor electrode layer 504.

Figure 5G:
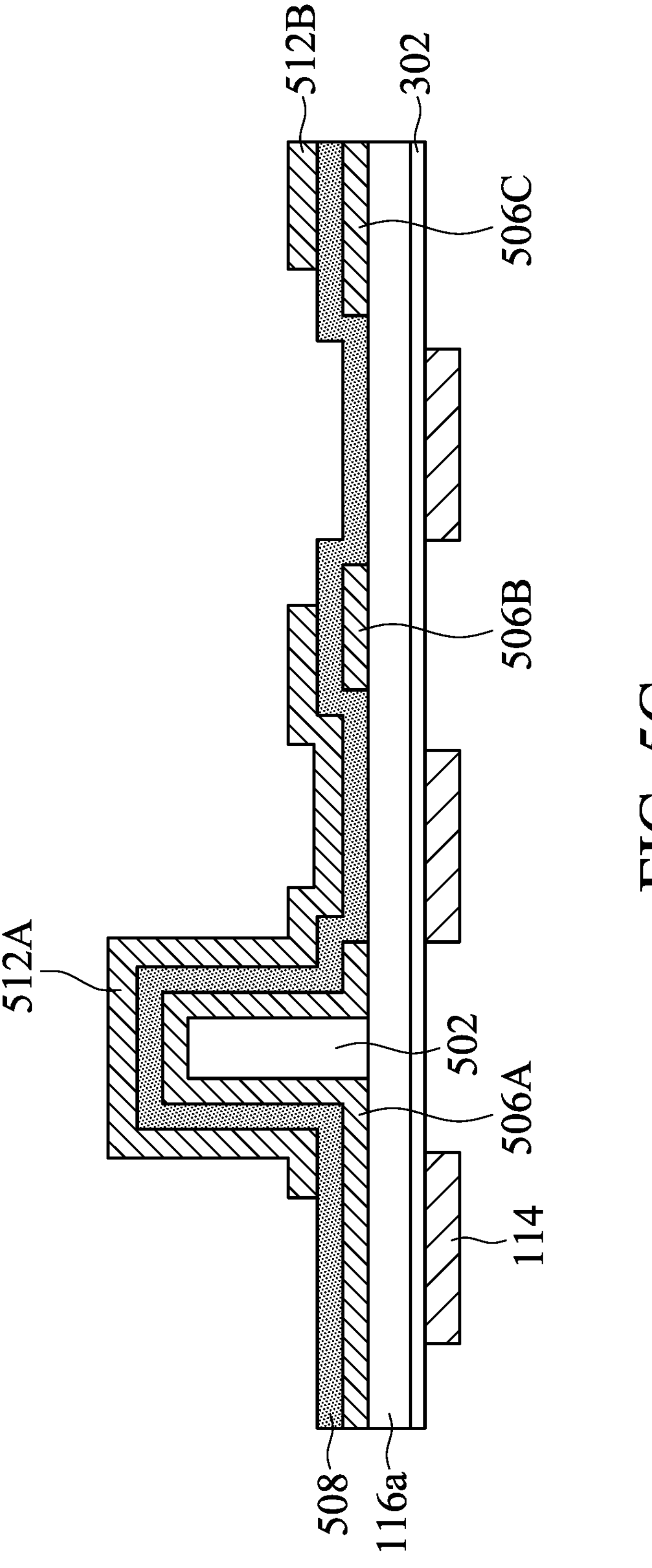

As shown in FIG. 5G, the capacitor electrode layer 510 is partially removed, in accordance with some embodiments. One or more photolithography processes and one or more etching processes may be used to partially remove the capacitor electrode layer 510. As a result, the remaining portions of the capacitor electrode layer 510 form multiple capacitor electrodes 512A and 512B, as shown in FIG. 5G.

Figure 5H:
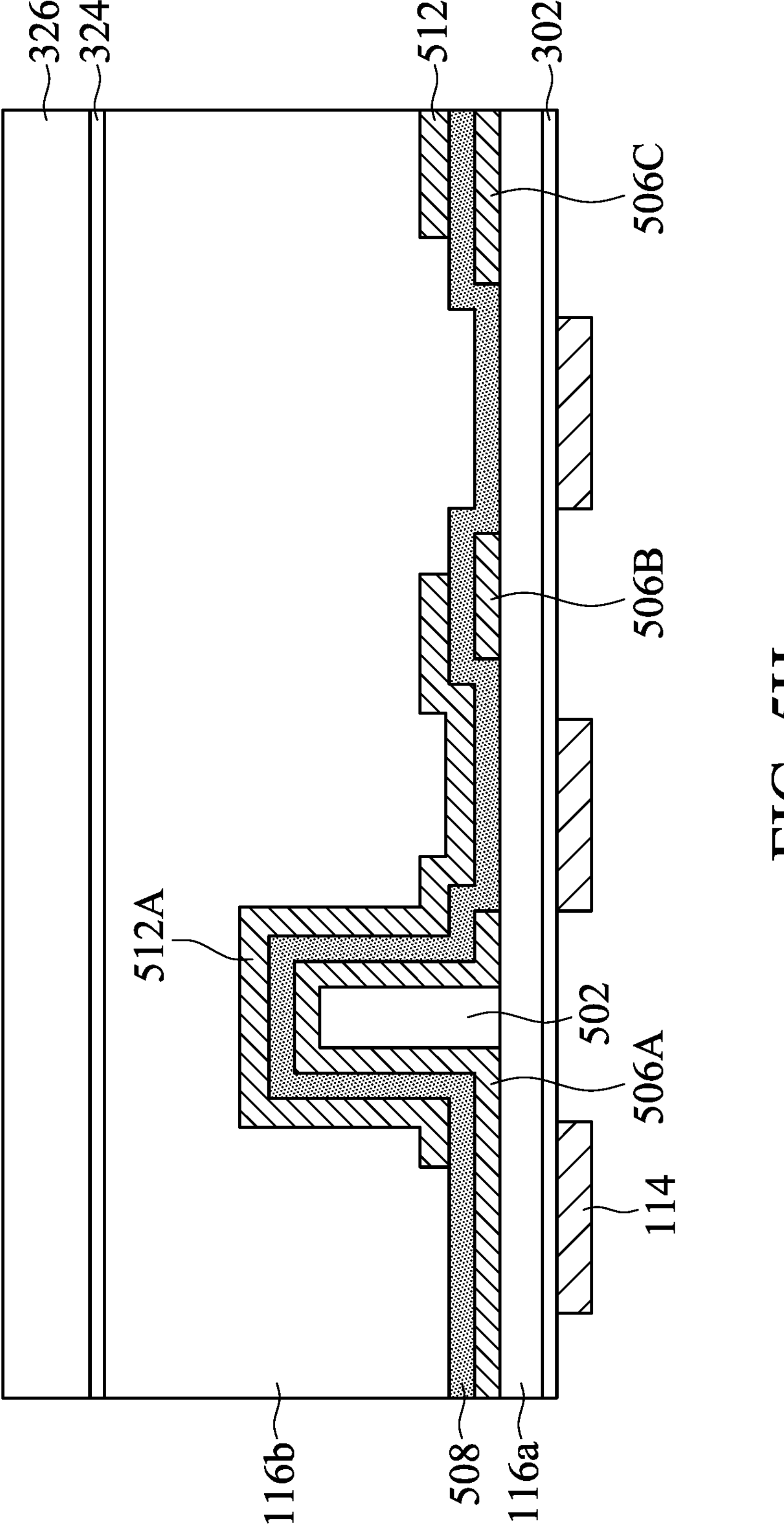

As shown in FIG. 5H, similar to the embodiments illustrated in FIGS. 3E-3F, a dielectric layer 116*b*, an etch stop layer 324, and a dielectric layer 326 are sequentially formed, in accordance with some embodiments.

Figure 5I:
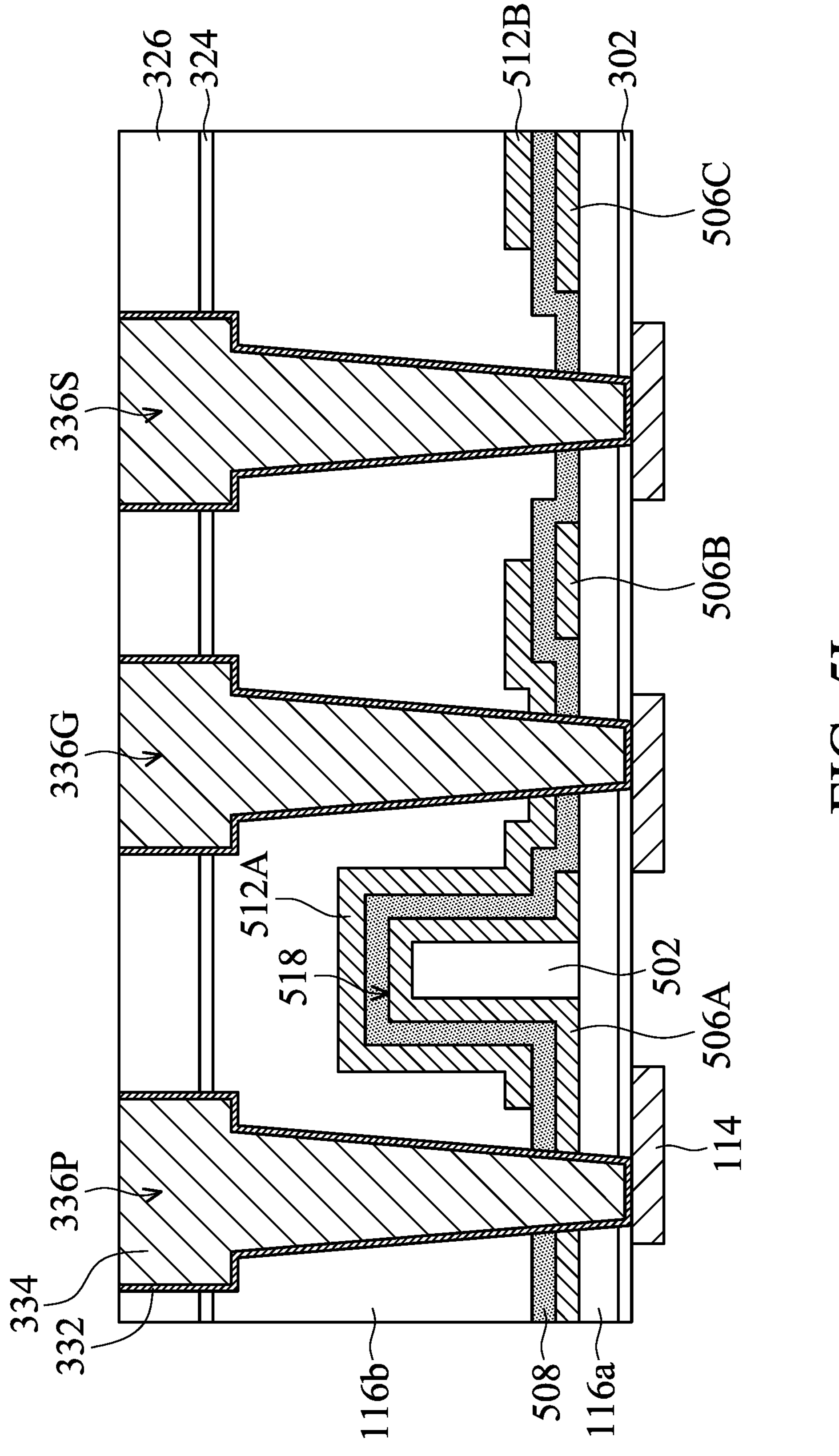

As shown in FIG. 5I, similar to the embodiments illustrated in FIGS. 3G-3I, conductive bonding structures 336P, 336G, and 336S are formed, in accordance with some embodiments. Each of the conductive bonding structures 336P, 336G, and 336S includes a barrier layer 332 and a conductive filling 334. Each of the conductive bonding structures 336P, 336G, and 336S may be function as the conductive bonding structures 122 shown in FIGS. 1F and 2. Each of the conductive bonding structures 336P, 336G, and 336S may be function as the conductive bonding structures 222 shown in FIG. 2.

As shown in FIG. 5I, the capacitor elements 518 are formed, in accordance with some embodiments. In some embodiments, the conductive bonding structures 336P and 336G are used to provide electrical connection to power and ground, respectively. In some embodiments, the conductive bonding structure 336P is electrically connected to the capacitor electrode 506A. In some embodiments, the conductive bonding structure 336P is in direct contact with the sidewalls of the capacitor electrode 506A. In some embodiments, the conductive bonding structure 336G is electrically connected to the capacitor electrode 512A. In some embodiments, the conductive bonding structure 336G is in direct contact with the sidewalls of the capacitor electrode 512A.

In some embodiments, the conductive bonding structure 336S is used to provide electrical connection to signal net of the chip structure 102A. In some embodiments, the conductive bonding structure 336S penetrates through the capacitor dielectric layer 508, as shown in FIG. 5I. In some embodiments, the conductive bonding structure 336S is in direct contact with the capacitor dielectric layer 508. In some embodiments, the conductive bonding structure 336S is electrically isolated from the capacitor electrodes 506A-506C and 512A-512B.

In some embodiments, the package structure is formed using a wafer-on-wafer (WoW) process. However, embodiments of the disclosure are not limited thereto. Many variations and/or modifications can be made to embodiments of the disclosure. In some embodiments, the package structure is formed using a chip-on-wafer (CoW) process.

Figure 6A:
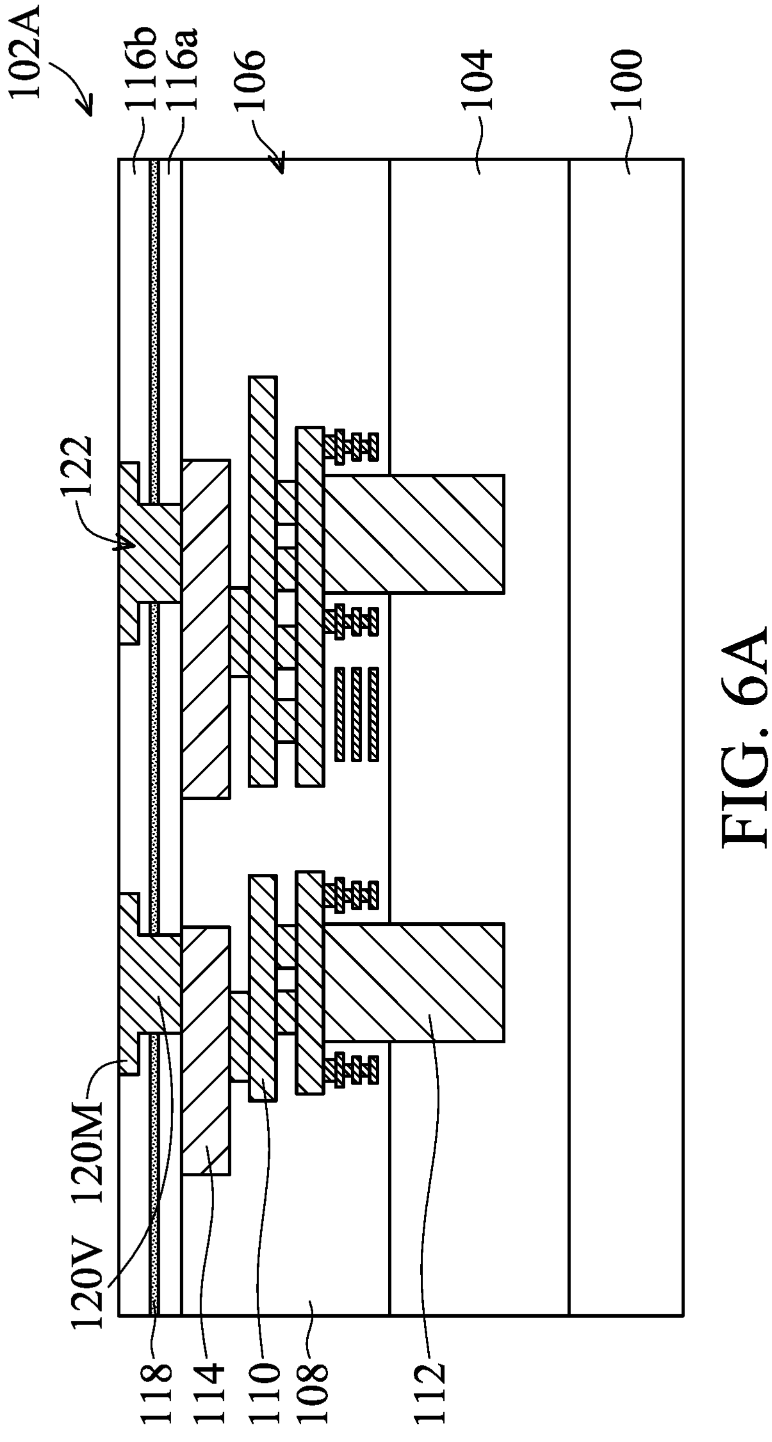
FIGS. 6A-6F are cross-sectional views of various stages of a process for forming a portion of a package structure, in accordance with some embodiments.

FIGS. 6A-6F are cross-sectional views of various stages of a process for forming a portion of a package structure, in accordance with some embodiments. As shown in FIG. 6A, a structure that is the same as or similar to the structure shown in FIG. 1B is formed. In some embodiments, the chip structure (or chip-containing structure) 102A is a semiconductor wafer.

Figure 6B:
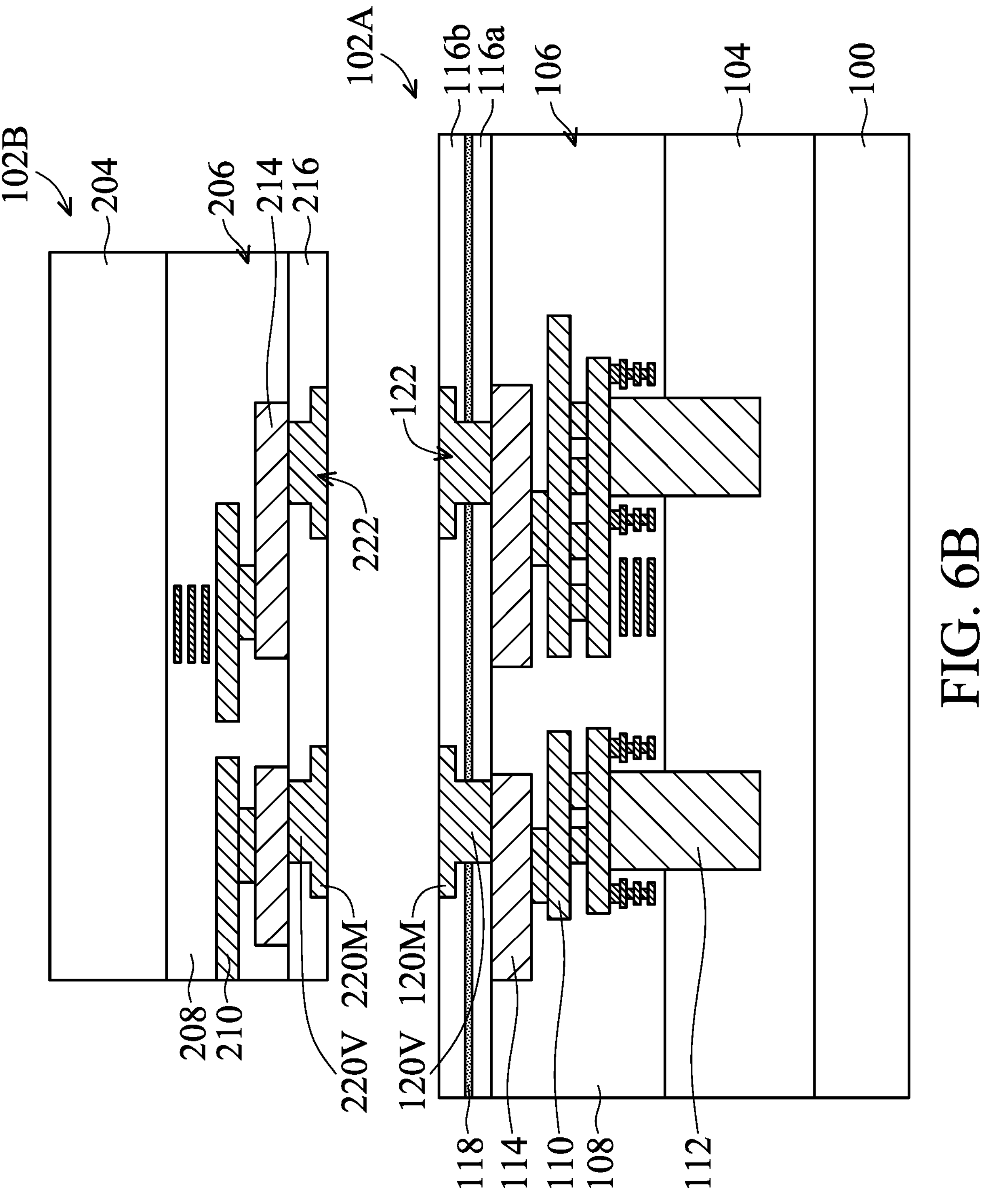

As shown in FIG. 6B, similar to the embodiments illustrated in FIG. 1C, a chip structure 102B is picked up and ready to be bonded to the chip structure 102A, in accordance with some embodiments. In some embodiments, the chip structure 102B is tested to ensure good quality before being bonded to the chip structure 102A. In some embodiments, the chip structure 102A (such as a semiconductor wafer) is wider than the chip structure 102B, as shown in FIG. 6B.

Figure 6C:
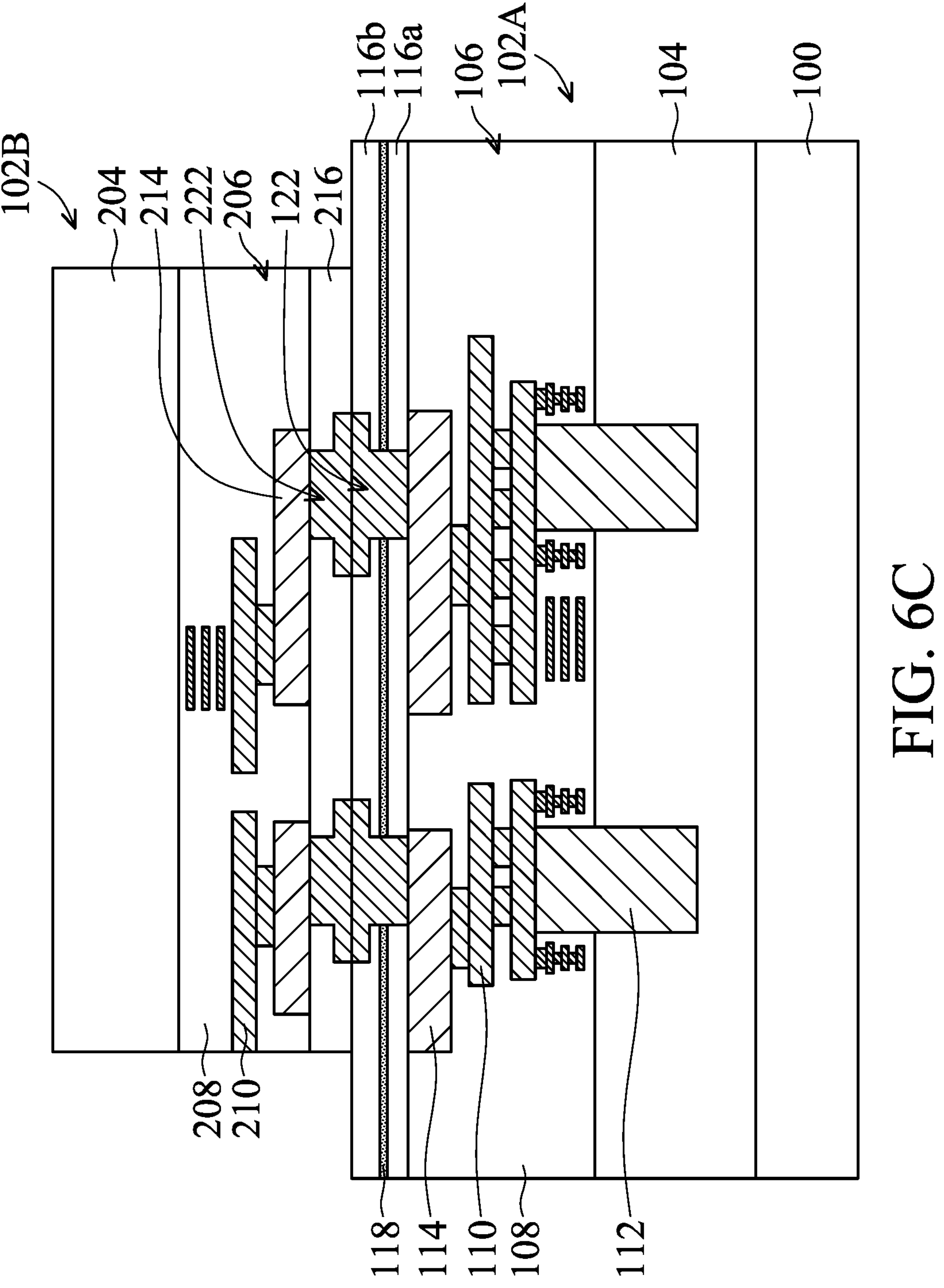

As shown in FIG. 6C, similar to the embodiments illustrated in FIG. 1D, the chip structure 102B is bonded to the chip structure 102A through dielectric-to-dielectric bonding and metal-to-metal bonding, in accordance with some embodiments. In some embodiments, there is no tin-containing solder element formed between the chip structures 102A and 102B.

Figure 6D:
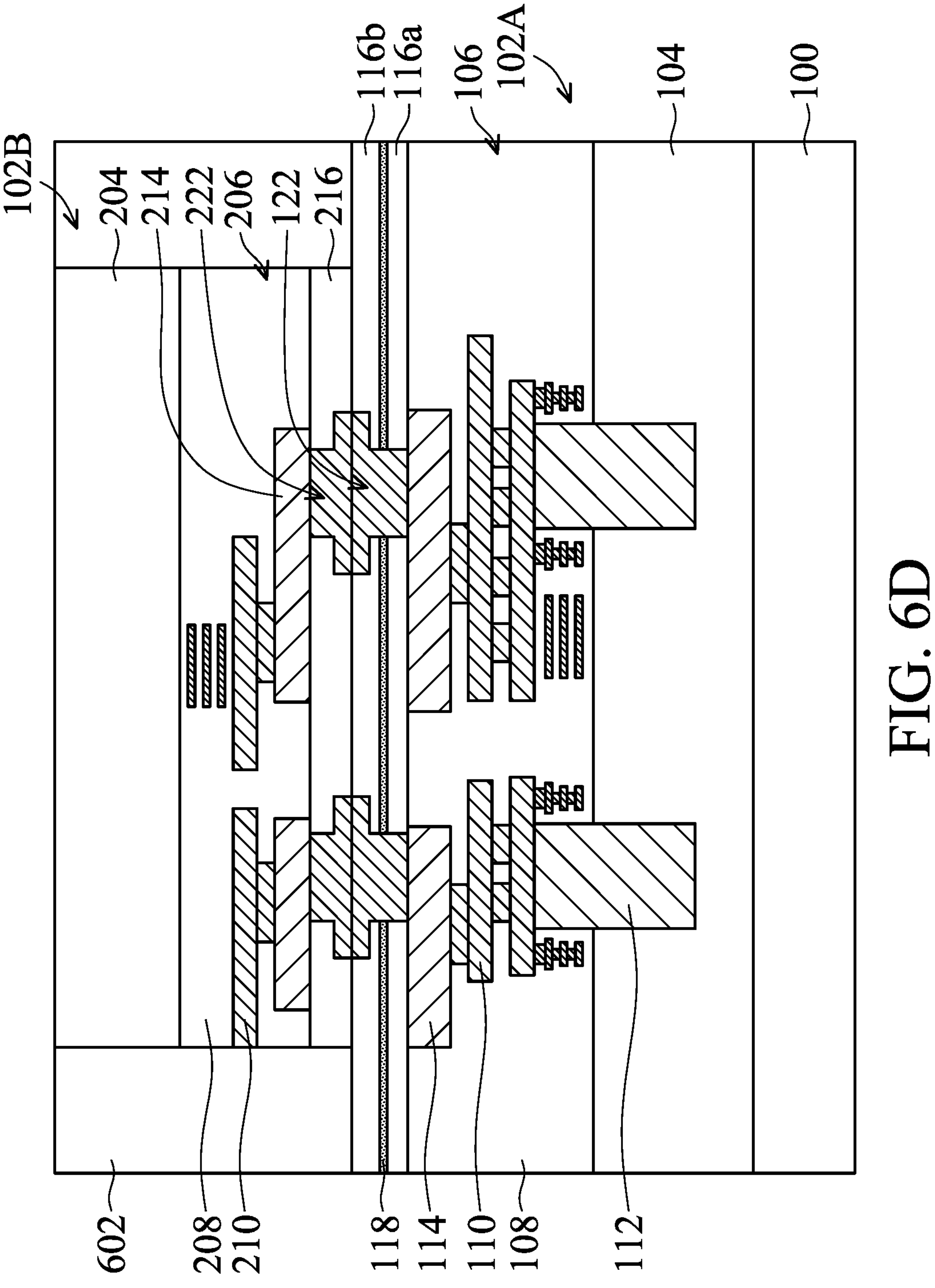

As shown in FIG. 6D, a protective layer 602 is formed over the chip structure 102A to laterally surround the chip structure 102B, in accordance with some embodiments. The protective layer 602 may be made of or include a molding material. The molding material may include an epoxy-based material dispersed with fillers such as silica fibers. Alternatively, the protective layer 602 may be made of or include silicon oxide or the like. A planarization process may be performed to partially remove the protective layer 602, so as to expose the chip structure 102B. The heat dissipation of the chip structure 102B may thus be improved.

Figure 6E:
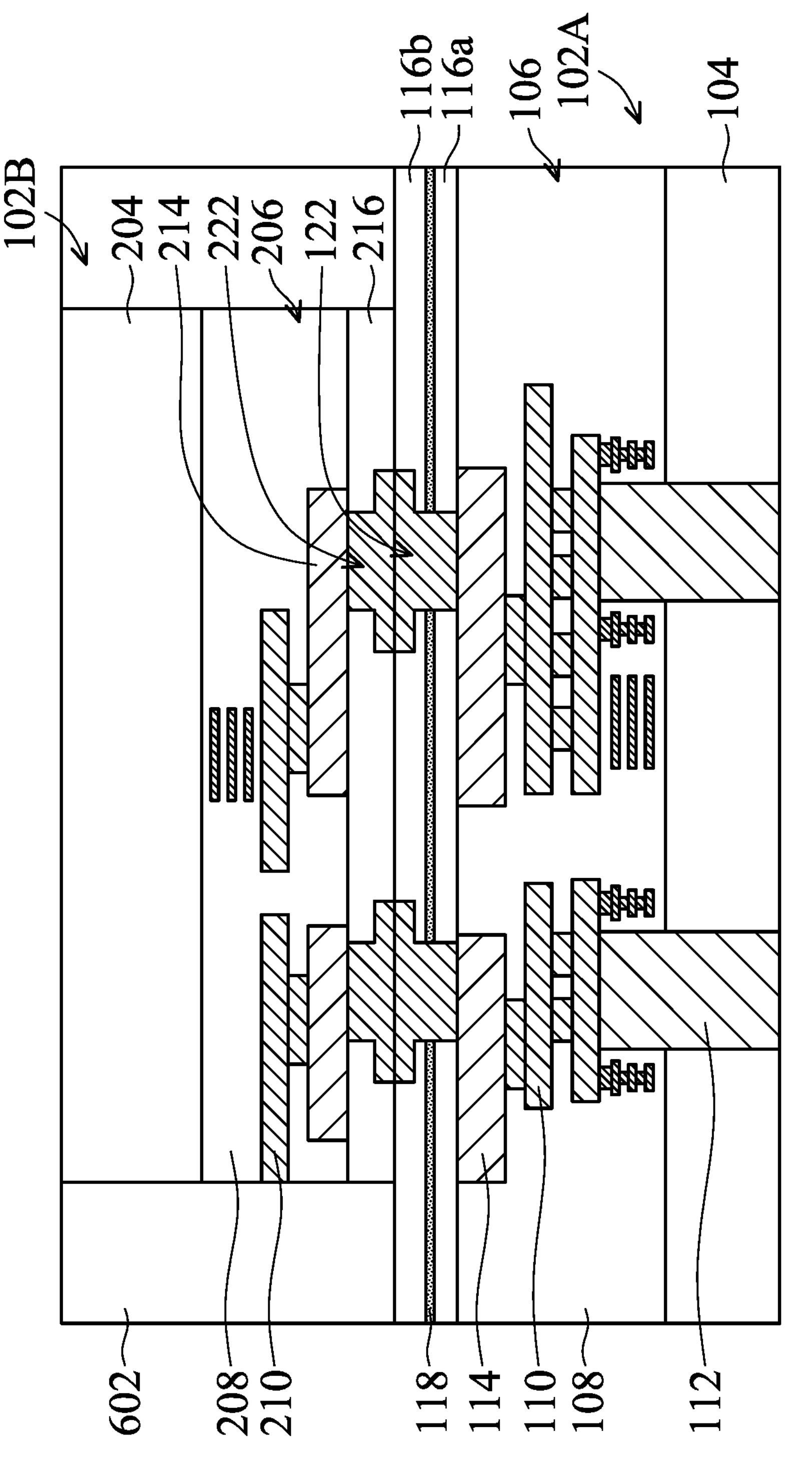

As shown in FIG. 6E, the carrier substrate 100 is removed, in accordance with some embodiments. The chip structure 102A is then thinned using a planarization process. The planarization process may include a CMP process, a grinding process, an etching process, another applicable process, or a combination thereof. As a result, the through-chip vias 112 that are originally covered by the semiconductor substrate 104 are exposed. In some embodiments, the through-chip vias 112 protrude from the bottom surface of the chip structure 102A.

Figure 6F:
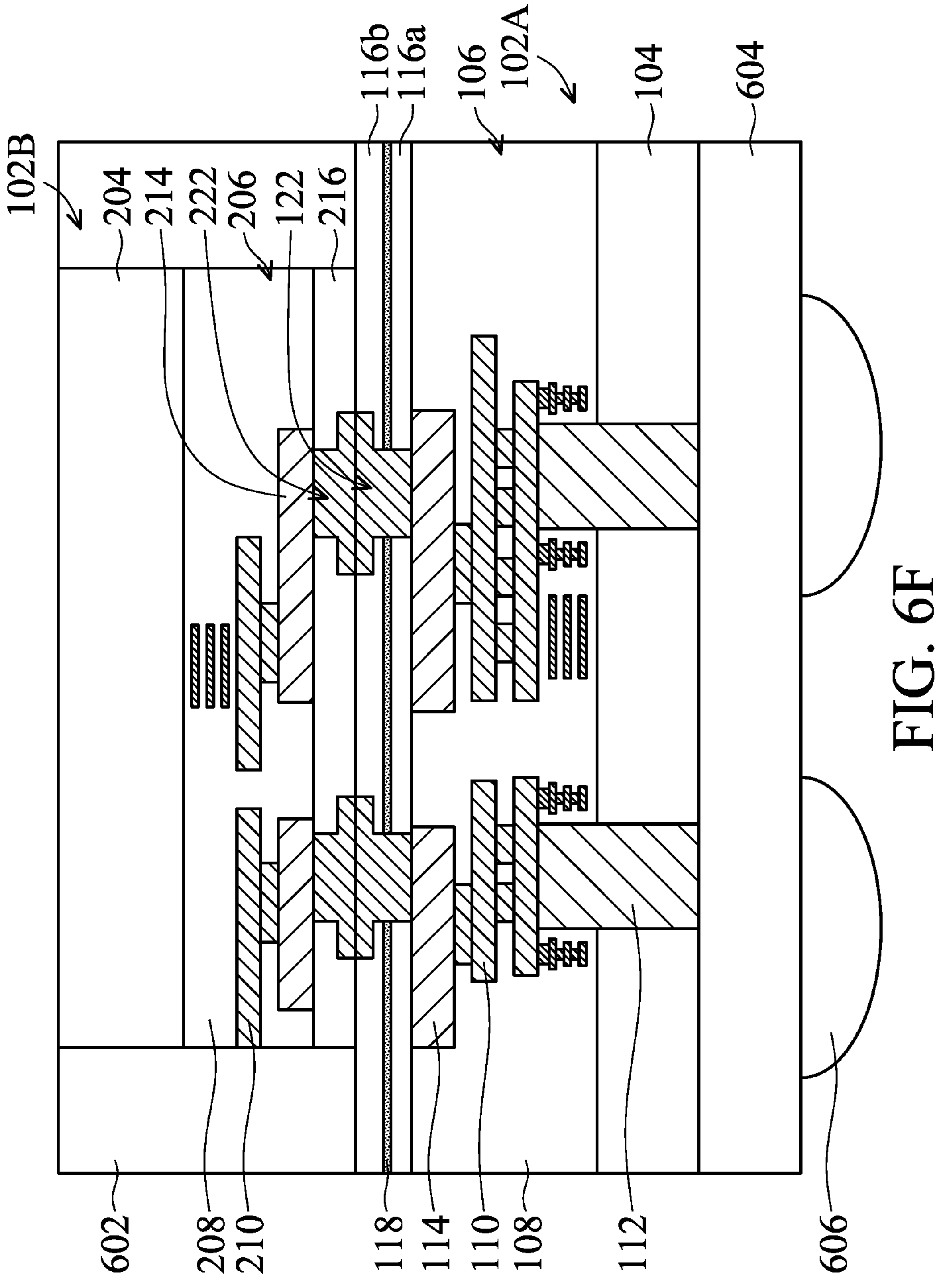

As shown in FIG. 6F, similar to the embodiments illustrated in FIG. 1F, a redistribution structure 604 and conductive bumps 606 are formed, in accordance with some embodiments. In some embodiments, a sawing process is used to separate the structure into multiple package structures. One of the package structures is shown in FIG. 6F. The package structure may function as a system on integrated chips (SoIC) that may further be integrated into another package. The package may include multiple chip structures bonded to an interposer substrate that is further bonded to another substrate. Alternatively, the package may include multiple chip structures surrounded by a protective layer and a redistribution structure formed on the chip structures and the protective layer.

Figure 7:
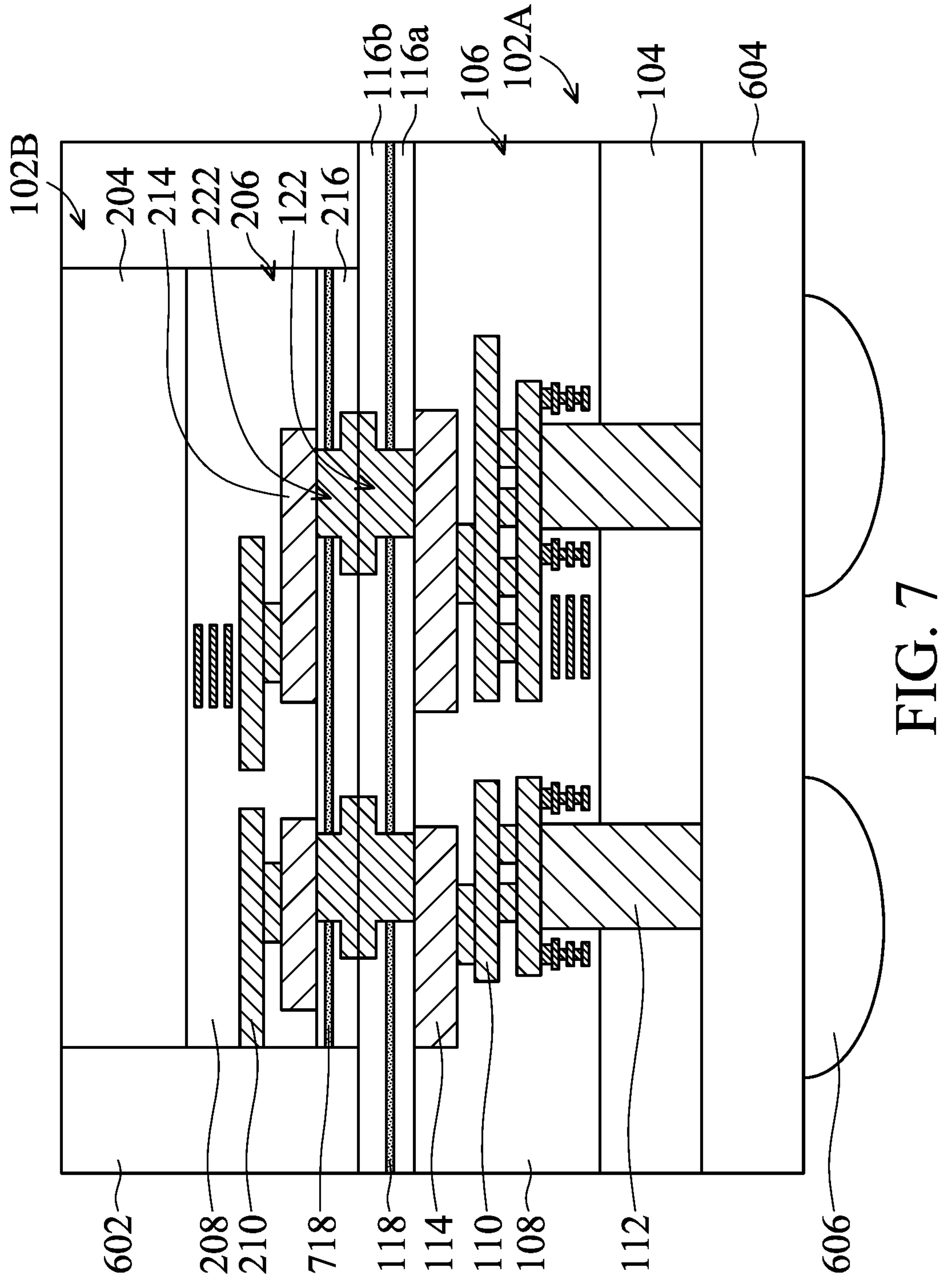
FIG. 7 is a cross-sectional view of a portion of a package structure, in accordance with some embodiments.

Many variations and/or modifications can be made to embodiments of the disclosure. FIG. 7 is a cross-sectional view of a portion of a package structure, in accordance with some embodiments. As shown in FIG. 7, similar to the embodiments illustrated in FIG. 2, one or more capacitor elements 718 are formed. The capacitor elements 718 are positioned beside the conductive vias of the conductive bonding structures 222. The capacitor elements 718 are laterally surrounded by the dielectric bonding structure 216 of the chip structure 102B. In some embodiments, some of the capacitor elements 718 and the conductive bonding structures 222 are electrically connected to each other. The capacitor elements 718 may be formed using the method illustrated in FIGS. 3A-3I, 4, and/or 5A-5I.

As mentioned above, in some embodiments, the package structure is formed using a chip-on-wafer (CoW) process. Many variations and/or modifications can be made to embodiments of the disclosure. In some embodiments, multiple chip structures are provided over a carrier wafer. As a result, a reconstructed wafer is formed.

Figure 8A:
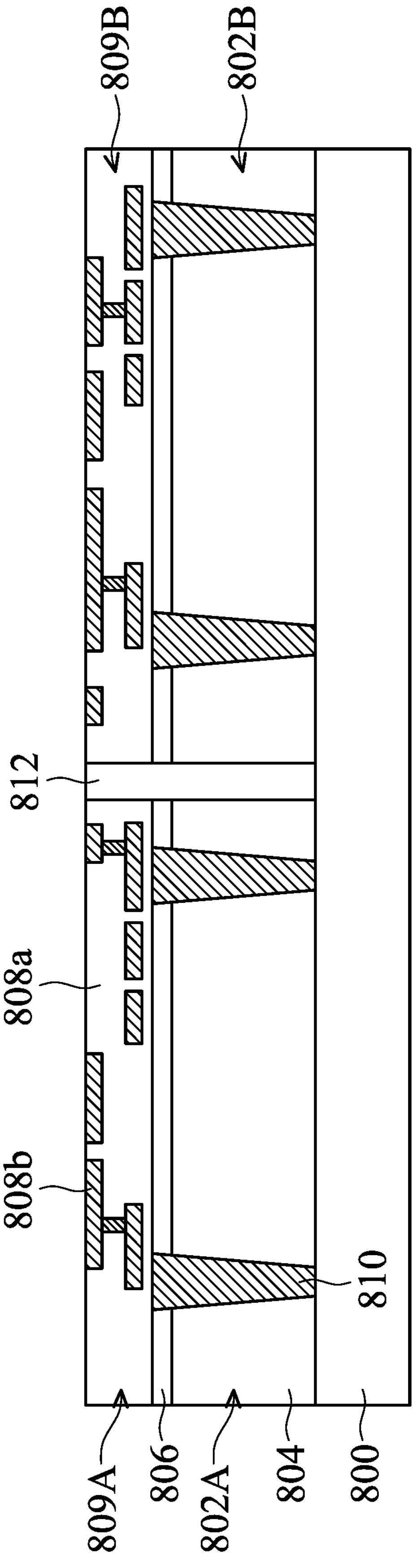
FIGS. 8A-8E are cross-sectional views of various stages of a process for forming a portion of a package structure, in accordance with some embodiments.

FIGS. 8A-8E are cross-sectional views of various stages of a process for forming a portion of a package structure, in accordance with some embodiments. As shown in FIG. 8A, multiple chip structures 802A and 802B are attached onto a carrier wafer 800, in accordance with some embodiments. The chip structures 802A and 802B are laterally spaced apart from each other. A dielectric layer 812 is formed in the gaps between these chip structures. As a result, a reconstructed wafer is formed, as shown in FIG. 8A.

In some embodiments, each of the chip structures 802A and 802B is similar to the chip structure 102A. Each of the chip structures 802A and 802B includes a semiconductor substrate 804 and a device portion 806. Multiple device elements such as transistors are formed in the device portion 806. The chip structures 802A and 802B also include front-side interconnection portions 809A and 809B. Each of the front-side interconnection portions 809A and 809B is used for forming interconnection between the device elements formed in the device portions 806. Similar to the front-side interconnection portion 106, each of the front-side interconnection portions 809A and 809B includes multiple dielectric layers 808*a* and multiple conductive features 808*b*. The chip structures 802A and 802B also include through-chip vias 810.

Figure 8B:
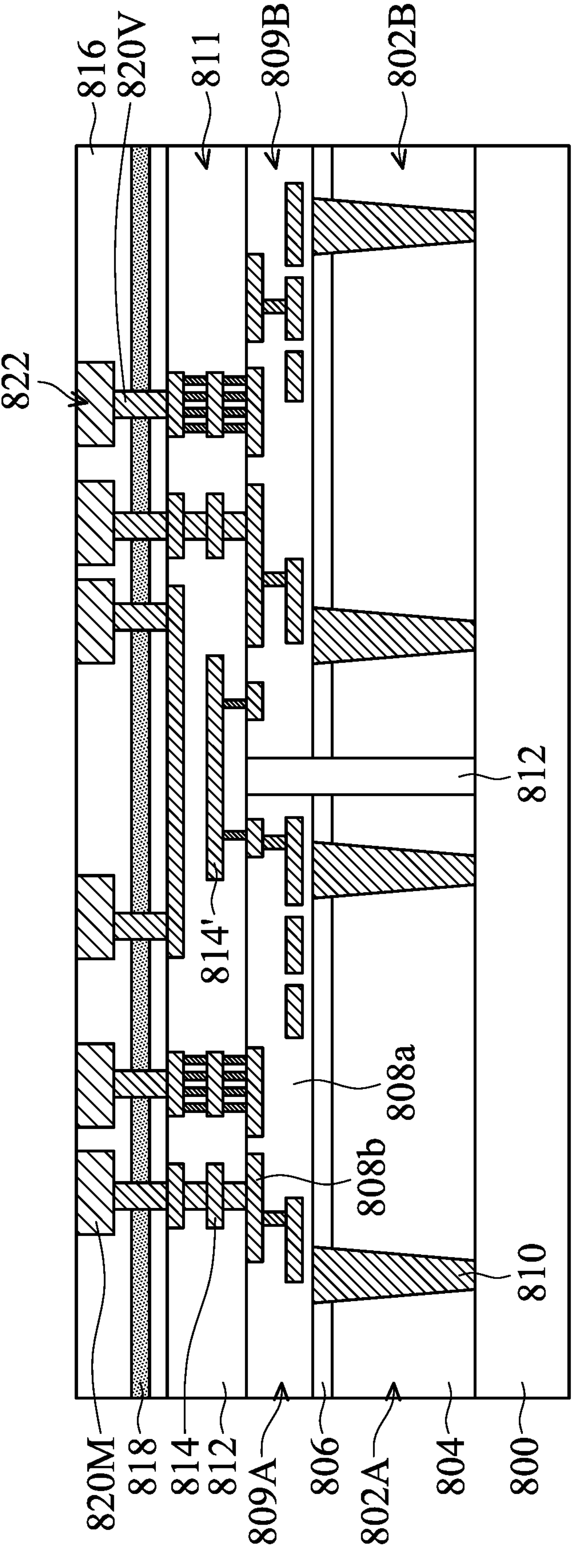

As shown in FIG. 8B, an interconnection structure 811 is formed over the reconstructed wafer, in accordance with some embodiments. The interconnection structure 811 extends across the opposite sidewalls of the chip structures 802A and 802B. The interconnection structure 811 includes multiple dielectric layers 812 and multiple conductive features 814. Some of the conductive features 814 (such as the conductive feature 814') are used to form electrical connection between the chip structures 802A and 802B, as shown in FIG. 8B.

Afterwards, similar to the embodiments mentioned above, a dielectric bonding structure 816 and conductive bonding structures 822 are formed over the interconnection structure 811, as shown in FIG. 8B in accordance with some embodiments. Similar to the conductive bonding structures 122, each of the conductive bonding structures 822 may include a metal bonding structure 820M and a conductive via 820V.

In some embodiments, capacitor elements 818 are formed around the conductive vias 820V, as shown in FIG. 8B. The capacitor elements 818 may be formed using the method illustrated in FIGS. 3A-3I, 4, and/or 5A-5I.

Figure 8C:
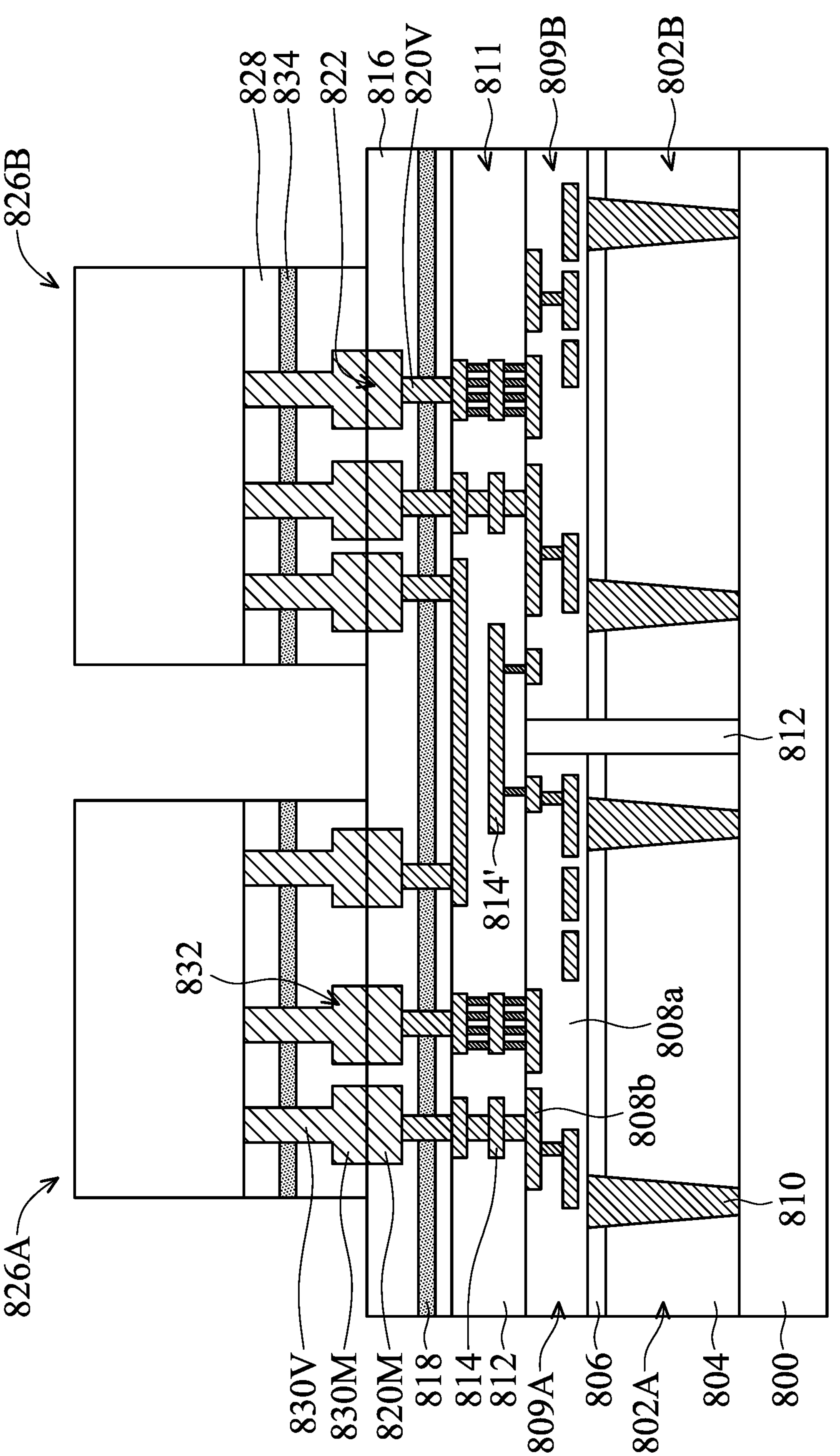

As shown in FIG. 8C, similar to the embodiments illustrated in FIGS. 6B-6C, multiple chip structures 826A and 826B are directly bonded to the dielectric bonding structure 816 and the conductive bonding structures 822, in accordance with some embodiments. In some embodiments, there is no tin-containing element formed therebetween.

Similar to the chip structure 102B illustrated in FIGS. 6B-6C, each of the chip structures 826A and 826B includes a dielectric bonding structure 828 and multiple conductive bonding structures 832. Similar to the conductive bonding structures 122, each of the conductive bonding structures 832 may include a metal bonding structure 830M and a conductive via 830V.

In some embodiments, capacitor elements 834 are formed beside the conductive vias 830V, as shown in FIG. 8C. The capacitor elements 834 may be formed using the method illustrated in FIGS. 3A-3I, 4, and/or 5A-5I.

Figure 8D:
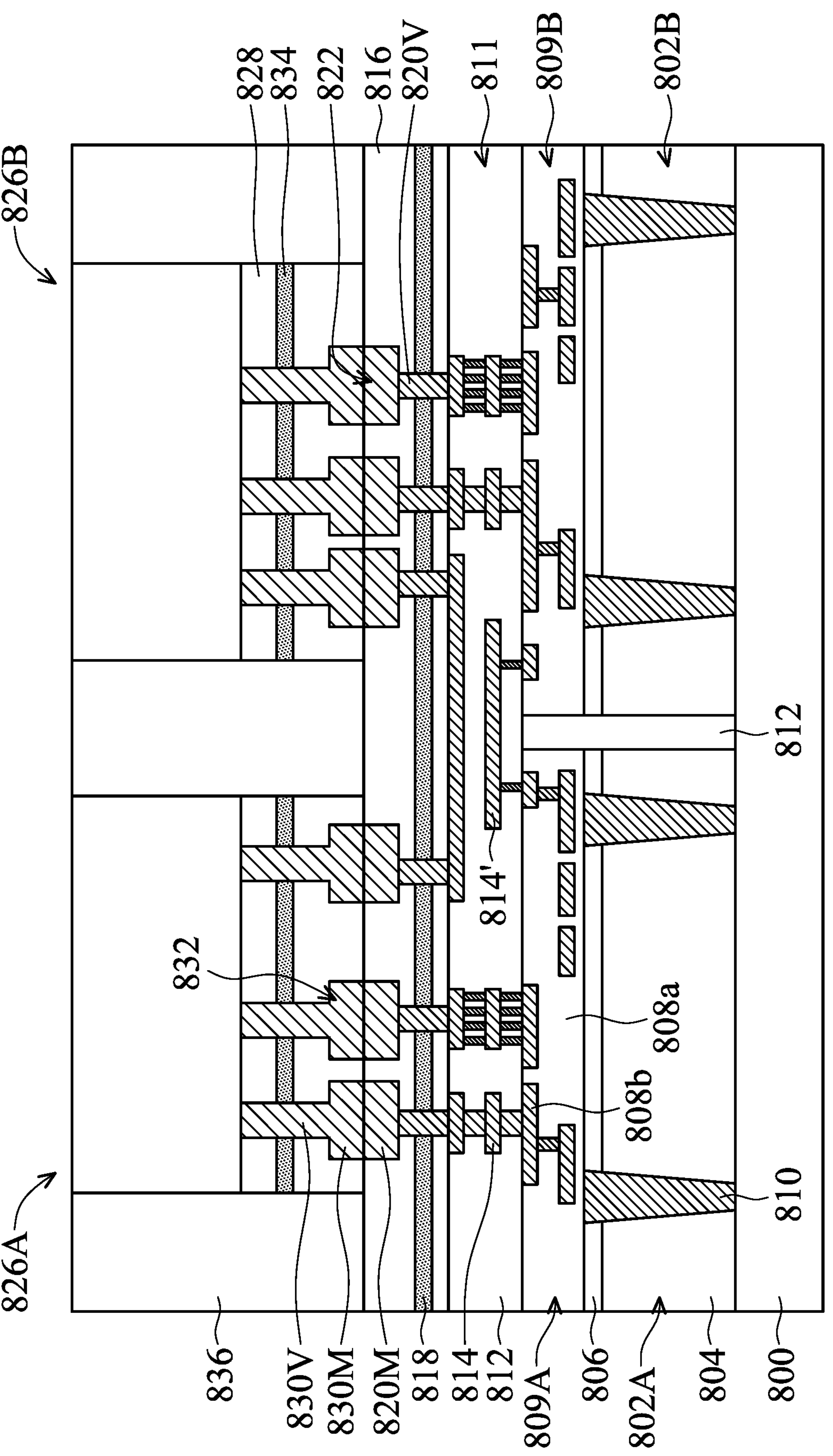

As shown in FIG. 8D, a protective layer 836 is formed over the interconnection structure 811 to laterally surround the chip structures 826A and 826B, in accordance with some embodiments. The material and formation method of the protective layer 836 may be the same as or similar to those of the protective layer 602 shown in FIG. 6D.

Figure 8E:
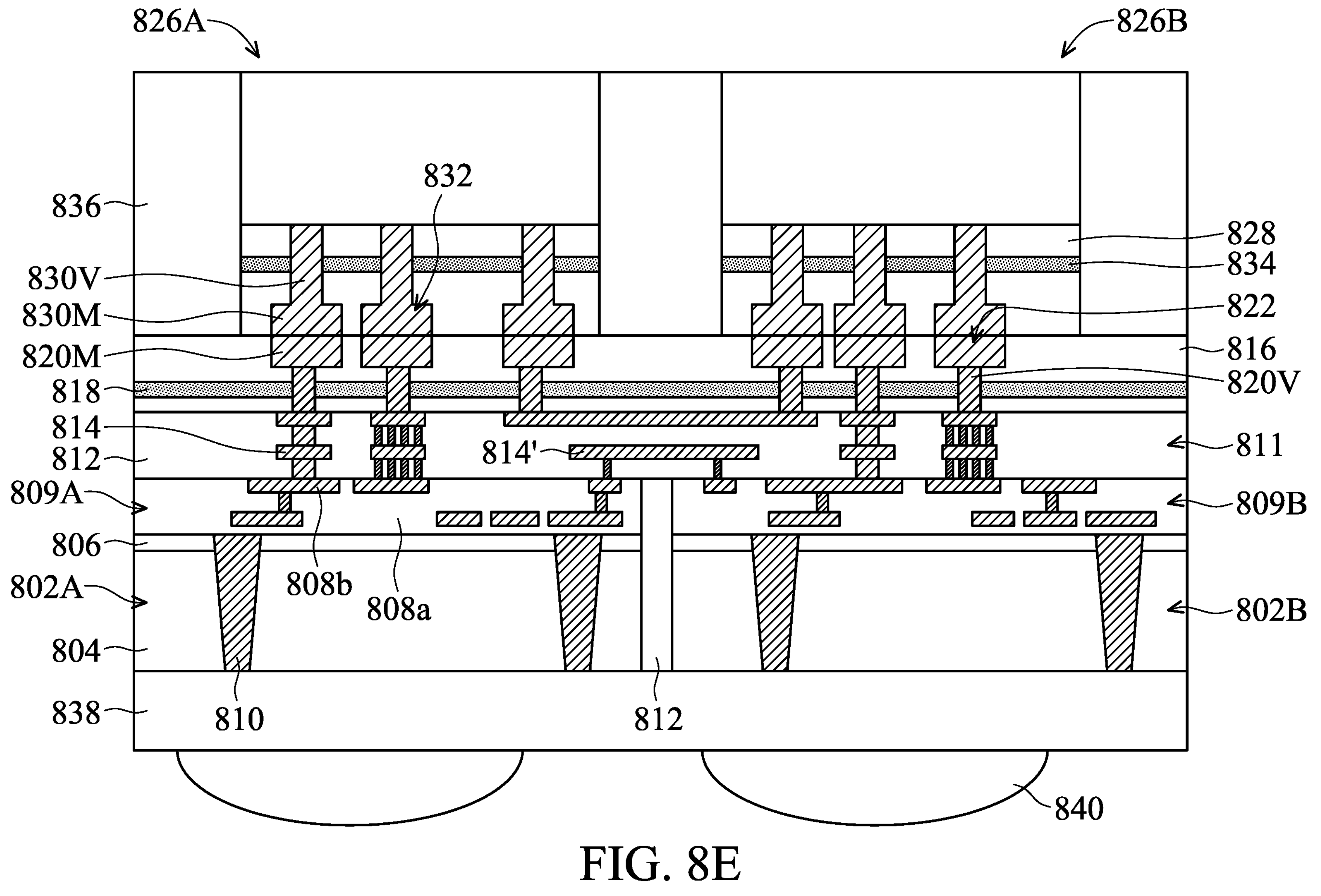

As shown in FIG. 8E, the carrier wafer 800 is removed, in accordance with some embodiments. The chip structures 802A and 802B are then thinned using a planarization process. The planarization process may include a CMP process, a grinding process, an etching process, another applicable process, or a combination thereof. As a result, the through-chip vias 810 that are originally covered by the semiconductor substrate 804 are exposed. In some embodiments, the through-chip vias 810 protrude from the bottom surface of the chip structures 802A and 802B.

As shown in FIG. 8E, similar to the embodiments illustrated in FIG. 1F, a redistribution structure 838 and conductive bumps 840 are formed, in accordance with some embodiments. In some embodiments, a sawing process is used to separate the structure into multiple package structures. One of the package structures is shown in FIG. 8E. The package structure may function as a system on integrated chips (SoIC) that may further be integrated into another package. The package may include multiple chip structures bonded to an interposer substrate that is further bonded to another substrate. Alternatively, the package may include multiple chip structures surrounded by a protective layer and a redistribution structure formed on the chip structures and the protective layer.

Embodiments of the disclosure form a package structure that includes a stack of multiple chip structures. The chip structures are directly bonded to each other through dielectric-to-dielectric bonding and metal-to-metal bonding. The metal-to-metal bonding is achieved by using conductive bonding structures. Each of the conductive bonding structures includes a metal bonding structure and a conductive via directly under the metal bonding structure. Capacitor elements are formed beside the conductive via. More available space for routing is thus obtained in interconnection portion of the chip structures. The performance and reliability of the package structure are improved.

In accordance with some embodiments, a method for forming a package structure is provided. The method includes forming a capacitor element over a first chip structure and forming a dielectric layer over the capacitor element. The method also includes forming a conductive bonding structure in the dielectric layer. A top surface of the conductive bonding structure is substantially coplanar with a top surface of the dielectric layer. The conductive bonding structure penetrates through the capacitor element and is electrically connected to the capacitor element. The method further includes bonding a second chip structure to the dielectric layer and the conductive bonding structure through dielectric-to-dielectric bonding and metal-to-metal bonding.

In accordance with some embodiments, a package structure is provided. The package structure includes a first chip structure. The first chip structure has a first metal bonding structure and a first conductive via. The first conductive via is in direct contact with the first metal bonding structure. The first chip structure also has a first dielectric layer laterally surrounding the first metal bonding structure and the first conductive via. A surface of the first dielectric layer and a surface of the first metal bonding structure are substantially coplanar. The package structure also includes a second chip structure over the first chip structure. The second chip structure has a second metal bonding structure, and the second metal bonding structure is in direct contact with the first metal bonding structure. The second chip structure also has a second conductive via in direct contact with the second metal bonding structure. The second chip structure further has a second dielectric layer laterally surrounding the second metal bonding structure and the second conductive via. A surface of the second dielectric layer and a surface of the second metal bonding structure are substantially coplanar, and the second dielectric layer is in direct contact with the first dielectric layer. The package structure further includes a capacitor element positioned between the first metal bonding structure and a bottom surface of the first conductive via.

In accordance with some embodiments, a package structure is provided. The package structure includes a first chip structure and an interconnection structure over the first chip structure. The package structure also includes a dielectric bonding structure over the interconnection structure and a metal bonding structure laterally surrounded by the dielectric bonding structure. A top surface of the metal bonding structure is substantially coplanar with a top surface of the dielectric bonding structure. The package structure further includes a conductive via connected to the metal bonding structure and laterally surrounded by the dielectric bonding structure. In addition, the package structure includes a second chip structure directly bonded to the dielectric bonding structure and the metal bonding structure. The package structure also includes a capacitor element positioned beside the conductive via and laterally surrounded by the dielectric bonding structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a package structure, comprising:
- forming a capacitor element over a first chip structure;
- forming a dielectric layer over the capacitor element;
- forming a conductive bonding structure in the dielectric layer, wherein a top surface of the conductive bonding structure is substantially coplanar with a top surface of the dielectric layer, and the conductive bonding structure penetrates through the capacitor element and is electrically connected to the capacitor element;
- bonding a second chip structure to the dielectric layer and the conductive bonding structure through dielectric-to-dielectric bonding and metal-to-metal bonding;
- disposing a third chip structure beside the first chip structure; and
- forming a protective layer laterally surrounding the first chip structure and the third chip structure before the capacitor element is formed, wherein the dielectric layer extends across opposite sidewalls of the first chip structure and the third chip structure after the dielectric layer is formed.

2. The method for forming a package structure as claimed in claim 1, wherein the formation of the capacitor element comprises:
- forming a first capacitor electrode over the first chip structure;
- forming a first capacitor dielectric layer over the first capacitor electrode and the first chip structure; and
- forming a second capacitor electrode over the first capacitor dielectric layer.

3. The method for forming a package structure as claimed in claim 2, further comprising:
- partially removing the dielectric layer and the capacitor element to form an opening, wherein the opening exposes a sidewall of the first capacitor electrode; and
- forming the conductive bonding structure in the opening.

4. The method for forming a package structure as claimed in claim 3, further comprising:
- partially removing the dielectric layer and the capacitor element to form a second opening, wherein the second opening exposes a sidewall of the second capacitor electrode; and
- forming a second conductive bonding structure in the second opening.

5. The method for forming a package structure as claimed in claim 4, wherein the opening and the second opening are formed simultaneously.

6. The method for forming a package structure as claimed in claim 4, wherein the conductive bonding structure and the second conductive bonding structure are formed simultaneously.

7. The method for forming a package structure as claimed in claim 4, further comprising:
- forming a third conductive bonding structure penetrating through the dielectric layer and the first capacitor dielectric layer, wherein the third conductive bonding structure is electrically isolated from the first capacitor electrode and the second capacitor electrode.

8. The method for forming a package structure as claimed in claim 4, wherein the formation of the capacitor element further comprises:

forming a second capacitor dielectric layer over the second capacitor electrode and the first capacitor dielectric layer;

forming a third capacitor electrode over the second capacitor dielectric layer;

forming a third capacitor dielectric layer over the third capacitor electrode and the second capacitor dielectric layer; and forming a fourth capacitor electrode over the third capacitor dielectric layer.

9. The method for forming a package structure as claimed in claim 8, wherein:

the conductive bonding structure is in direct contact with the sidewall of the first capacitor electrode and a sidewall of the third capacitor electrode, and the second conductive bonding structure is in direct contact with the sidewall of the second capacitor electrode and a sidewall of the fourth capacitor electrode.

10. The method for forming a package structure as claimed in claim 1, wherein the dielectric layer extends across opposite sidewalls of the second chip structure.

11. A package structure, comprising:

a first chip structure, wherein the first chip structure has:

a first metal bonding structure;

a first conductive via, wherein the first conductive via is in direct contact with the first metal bonding structure; and a first dielectric layer laterally surrounding the first metal bonding structure and the first conductive via, wherein a surface of the first dielectric layer and a surface of the first metal bonding structure are substantially coplanar;

a second chip structure over the first chip structure, wherein the second chip structure has:

a second metal bonding structure, wherein the second metal bonding structure is in direct contact with the first metal bonding structure;

a second conductive via in direct contact with the second metal bonding structure; and a second dielectric layer laterally surrounding the second metal bonding structure and the second conductive via, wherein a surface of the second dielectric layer and a surface of the second metal bonding structure are substantially coplanar, and the second dielectric layer is in direct contact with the first dielectric layer; and a capacitor element positioned between the first metal bonding structure and a bottom surface of the first conductive via, wherein:

the first chip structure has a third metal bonding structure and a third conductive via in direct contact with the third metal bonding structure, the first dielectric layer laterally surrounds the third metal bonding structure and the third conductive via, the surface of the first dielectric layer and a surface of the third metal bonding structure are substantially coplanar, the capacitor element has a first electrode and a second electrode, the first electrode is electrically connected to the first conductive via, and the second electrode is electrically connected to the third conductive via.

12. The package structure as claimed in claim 11, wherein:

the capacitor element further has a third electrode and a fourth electrode, the third electrode is electrically connected to the first conductive via, and the fourth electrode is electrically connected to the third conductive via.

13. The package structure as claimed in claim 12, wherein:

a portion of the second electrode is between the first electrode and the third electrode, and a portion of the third electrode is between the second electrode and the fourth electrode.

14. The package structure as claimed in claim 11, wherein:

the first conductive via is in direct contact with a sidewall of the first electrode, and the third conductive via is in direct contact with a sidewall of the second electrode.

15. The package structure as claimed in claim 11, further comprising:

a second capacitor element positioned between the second metal bonding structure and a top surface of the second conductive via.

16. The package structure as claimed in claim 11, further comprising:

a second capacitor element, wherein the second capacitor element is positioned between the capacitor element and the first chip structure.

17. A package structure, comprising:

a first chip structure;

an interconnection structure over the first chip structure;

a dielectric bonding structure over the interconnection structure;

a metal bonding structure laterally surrounded by the dielectric bonding structure, wherein a top surface of the metal bonding structure is substantially coplanar with a top surface of the dielectric bonding structure;

a conductive via connected to the metal bonding structure and laterally surrounded by the dielectric bonding structure;

a second chip structure directly bonded to the dielectric bonding structure and the metal bonding structure;

a capacitor element positioned beside the conductive via and laterally surrounded by the dielectric bonding structure; and a third chip structure laterally spaced apart from the first chip structure, wherein the interconnection structure extends across opposite sidewalls of the first chip structure and the third chip structure.

18. The package structure as claimed in claim 17, wherein the capacitor element has an electrode, and the conductive via is in direct contact with a sidewall of the electrode.

19. The package structure as claimed in claim 18, further comprising:

a second capacitor element between the capacitor element and the interconnection structure, wherein the second capacitor element has a second electrode, and the second electrode is electrically connected to the conductive via.

20. The package structure as claimed in claim 17, further comprising:

a second conductive via penetrating through a capacitor dielectric layer of the capacitor element, wherein the second conductive via is electrically isolated from capacitor electrodes of the capacitor element.

* * * * *